(12) United States Patent
Kishi et al.

(10) Patent No.: US 7,599,156 B2
(45) Date of Patent: Oct. 6, 2009

(54) MAGNETORESISTIVE ELEMENT HAVING SPECIALLY SHAPED FERROMAGNETIC LAYER

(75) Inventors: Tatsuya Kishi, Yokohama (JP);
Masahiko Nakayama, Fuchu (JP);
Yoshiaki Fukuzumi, Yokohama (JP);
Tadashi Kai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 659 days.

(21) Appl. No.: 11/244,153

(22) Filed: Oct. 6, 2005

(65) Prior Publication Data

US 2006/0082933 A1 Apr. 20, 2006

(30) Foreign Application Priority Data

| Oct. 8, 2004 | (JP) | ............................. 2004-296457 |
| Oct. 28, 2004 | (JP) | ............................. 2004-314359 |

(51) Int. Cl.
*G11B 5/33* (2006.01)
(52) U.S. Cl. ................................................ 360/324.11
(58) Field of Classification Search ............ 360/324.11, 360/324.12, 324.2; 257/295, 296; 365/171, 365/173
See application file for complete search history.

(56) References Cited

U.S. PATENT DOCUMENTS

| 5,748,524 | A | | 5/1998 | Chen et al. |
| 5,757,695 | A | | 5/1998 | Shi et al. |
| 5,923,583 | A | * | 7/1999 | Womack ..................... 365/171 |
| 5,953,248 | A | | 9/1999 | Chen et al. |
| 6,104,633 | A | | 8/2000 | Abraham et al. |
| 6,205,053 | B1 | | 3/2001 | Anthony |
| 6,605,836 | B2 | | 8/2003 | Kishi et al. |
| 6,765,824 | B2 | | 7/2004 | Kishi et al. |
| 6,798,691 | B1 | | 9/2004 | Ounadjela et al. |
| 6,906,369 | B2 | * | 6/2005 | Ross et al. ................... 257/295 |
| 6,949,779 | B2 | | 9/2005 | Kai et al. |
| 7,002,839 | B2 | * | 2/2006 | Kawabata et al. ............ 365/171 |
| 7,307,876 | B2 | * | 12/2007 | Kent et al. ................... 365/171 |
| 7,326,982 | B2 | * | 2/2008 | Iwata et al. .................. 257/296 |
| 2004/0094785 | A1 | * | 5/2004 | Zhu et al. ..................... 257/295 |
| 2005/0078417 | A1 | | 4/2005 | Kishi et al. |
| 2005/0199926 | A1 | | 9/2005 | Fukuzumi et al. |

FOREIGN PATENT DOCUMENTS

| JP | 9-251621 | 9/1997 |
| JP | 11-273337 | 10/1999 |
| JP | 2001-15826 | 1/2001 |

(Continued)

OTHER PUBLICATIONS

U.S. Appl. No. 12/019,657, filed Jan. 25, 2008, Kai et al.

(Continued)

*Primary Examiner*—Angel A. Castro
(74) *Attorney, Agent, or Firm*—Oblon, Spivak, McClelland, Maier & Neustadt, L.L.P.

(57) ABSTRACT

A magnetoresistive element according to an example of the present invention has a stacked structure comprised first and second ferromagnetic layers and a nonmagnetic layer disposed between these ferromagnetic layers, and a planar shape of at least one of the first and second ferromagnetic layers has a shape formed by combining two or more parts each having a shape of a character C.

3 Claims, 13 Drawing Sheets

| FOREIGN PATENT DOCUMENTS | | |
|---|---|---|
| JP | 2002-56665 | 2/2002 |
| JP | 2002-151660 | 5/2002 |
| JP | 2002-280637 | 9/2002 |
| JP | 2002-289945 | 10/2002 |
| JP | 2003-78112 | 3/2003 |
| JP | 2004-128067 | 4/2004 |
| JP | 3546238 | 4/2004 |
| JP | 2004-146614 | 5/2004 |
| JP | 2004-165441 | 6/2004 |
| JP | 2005-535111 | 11/2005 |
| JP | 2005-353788 | 12/2005 |
| JP | 2006-108566 | 4/2006 |
| JP | 2006-135292 | 5/2006 |
| WO | WO 2004/010436 A1 | 1/2004 |

OTHER PUBLICATIONS

U.S. Appl. No. 12/019,743, filed Jan. 25, 2008, Nakayama et al.
U.S. Appl. No. 12/037,726, filed Feb. 26, 2008, Nakayama et al.
U.S. Appl. No. 10/933,247, filed Sep. 3, 2004, Yoshihisa Iwata, et al.
U.S. Appl. No. 11/378,351, filed Mar. 20, 2006, Ikegawa et al.
U.S. Appl. No. 11/378,358, filed Mar. 20, 2006, Kai et al.
U.S. Appl. No. 11/389,110, filed Mar. 27, 2006, Nakayama et al.
U.S. Appl. No. 11/935,923, filed Nov. 6, 2007, Iwata et al.
U.S. Appl. No. 11/245,353, filed Oct. 7, 2005, Nakayama et al.

* cited by examiner

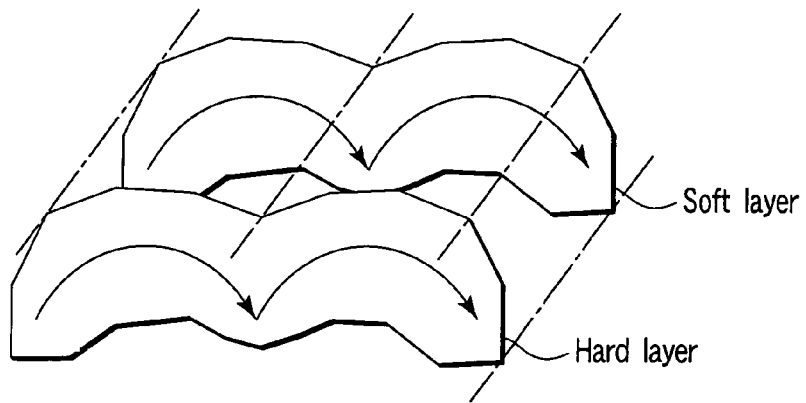
F I G. 17
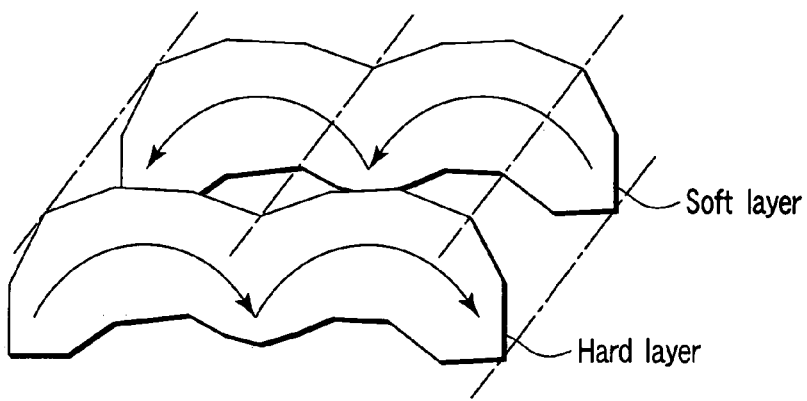
F I G. 18
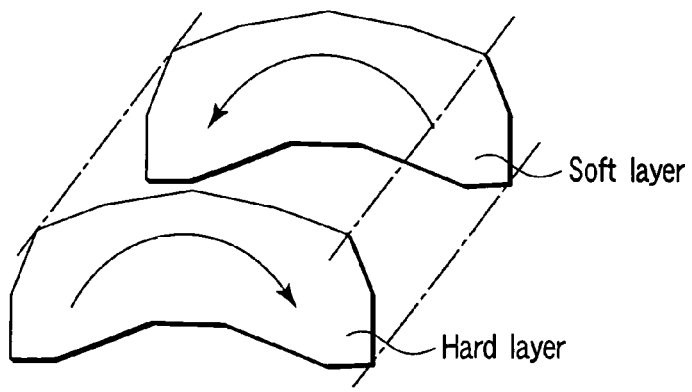
F I G. 19

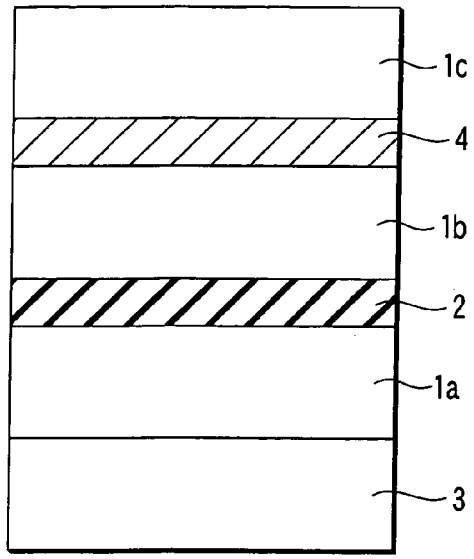
F I G. 43
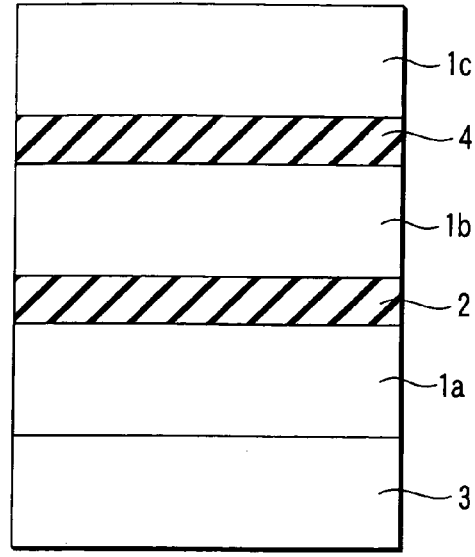
F I G. 44
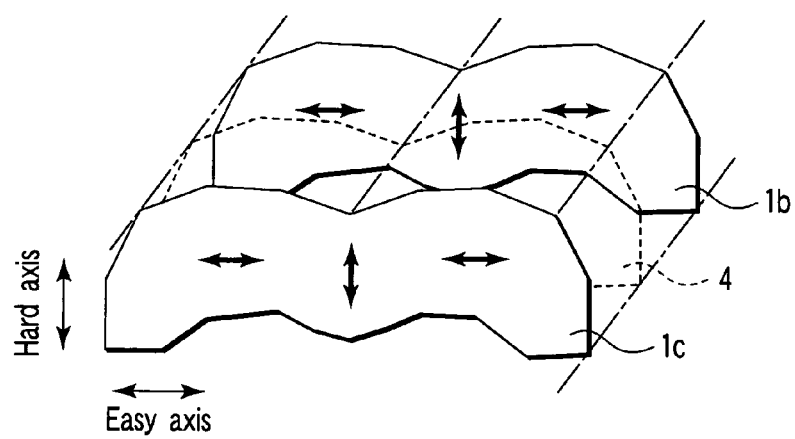
F I G. 45

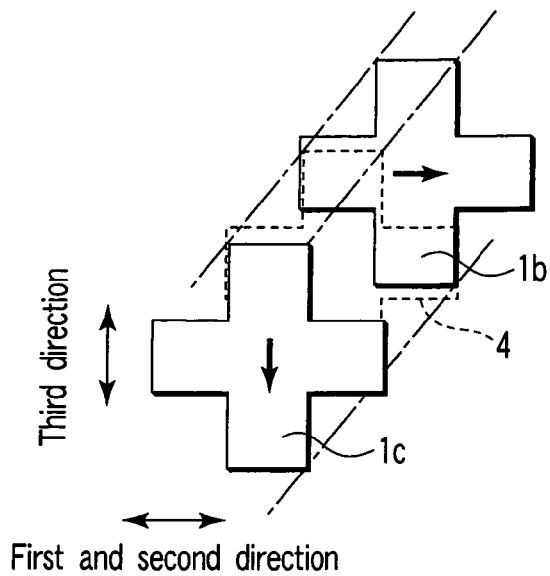
F I G. 46
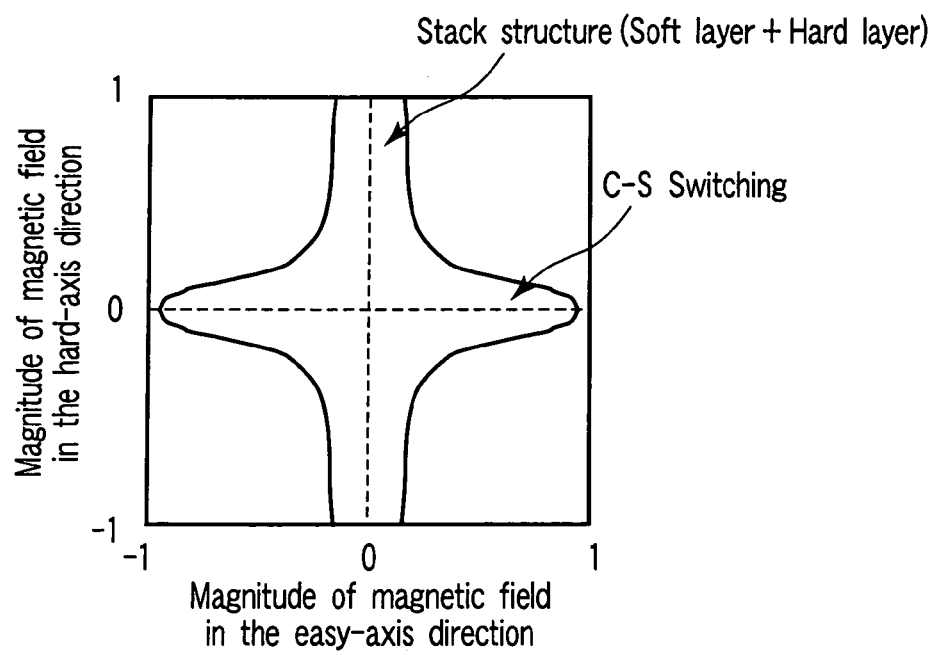
F I G. 47

MAGNETORESISTIVE ELEMENT HAVING SPECIALLY SHAPED FERROMAGNETIC LAYER

CROSS-REFERENCE TO RELATED APPLICATIONS

This application is based upon and claims the benefit of priority from prior Japanese Patent Applications No. 2004-296457, filed Oct. 8, 2004; and No. 2004-314359, filed Oct. 28, 2004, the entire contents of both of which are incorporated herein by reference.

BACKGROUND OF THE INVENTION

1. Field of the Invention

The present invention relates to a shape of a magnetoresistive element, and is used for, in particular, a magnetic random access memory.

2. Description of the Related Art

In recent years, with development of a magnetic memory element indicating a giant magneto resistive (GMR) effect, an element having a ferromagnetic tunnel junction has been used as a memory element of a magnetic memory.

The ferromagnetic tunnel junction is comprised a stacked structure made of a ferromagnetic layer, an insulating layer, and a ferromagnetic layer, and a tunnel current flows in the insulating layer by applying a voltage between the two ferromagnetic layers. In this case, a junction resistance value changes in proportion to a cosine of a relative angle of a magnetization orientation of the two ferromagnetic layers.

Therefore, the junction resistance value is obtained as the smallest value when the magnetization orientations of the two ferromagnetic layers are identical to each other (in a parallel state), and conversely, the junction resistance value is obtained as the largest value when the magnetization orientations of the two ferromagnetic layers are opposite to each other (in an anti-parallel state).

A phenomenon that such a junction resistance value changes depending on magnetization patterns of the two ferromagnetic layers is called a tunneling magneto resistive (TMR) effect. Recently, there has been reported that a change rate (MR ratio) of a resistance value of a magneto tunnel junction (MTJ) element caused by the TMR effect becomes 49.7% at a normal temperature.

In the magnetoresistive element having the ferromagnetic tunnel junction, one of the two ferromagnetic layers is defined as a pinned layer having a magnetization pattern fixed thereto, and the other is defined as a free layer in which a magnetization pattern changes according to data. In addition, when magnetization of the pinned layer and the free layer is in a parallel state, it is defined as "0", and when the magnetization is in an anti-parallel state, it is defined as "1".

A data write operation is carried out by providing a magnetic field generated by a write current supplied to a write line to a magnetoresistive element, and inverting the magnetization orientation of the free layer of the magnetoresistive element. A data readout operation is carried out by supplying a readout current to the ferromagnetic tunnel junction of the magnetoresistive element, and detecting a resistance change of the ferromagnetic tunnel junction caused by the TMR effect.

A magnetic memory is configured by disposing such magnetoresistive elements in an arrayed shape. With respect to an actual configuration, one switching transistor is connected to one magnetoresistive element as in, for example, a dynamic random access memory (DRAM) such that the magnetoresistive element can be accessed in random.

Further, there has been proposed a technique of disposing a magnetoresistive element in which a diode and a ferromagnetic tunnel junction are combined with each other at a position at which a word line and a bit line cross each other.

Considering high integration of the magnetoresistive element having the ferromagnetic tunnel junction, a cell size must be reduced, and thus, the size of the ferromagnetic layer of the magnetoresistive element becomes inevitably small.

Here, as the property of the ferromagnetic layer, a magnetic structure (magnetization pattern) of the ferromagnetic layer is comprised a plurality of magnetization zones. In the case of a rectangular ferromagnetic layer, the magnetic structure of a center portion in a long axis direction configures a magnetization zone in which magnetization is oriented in a direction along a long edge, while the magnetic structure of both ends in the long axis direction configures a magnetization zone in which magnetization is oriented in a direction along a short edge, a so-called edge domain.

The edge domain causes reduction of an MR ratio caused by the TMR effect, and a rate of the reduction of the MR ratio caused by the edge domain becomes larger as the size of the ferromagnetic layer becomes smaller. In addition, when switching (magnetization inversion) of a magnetization pattern of the ferromagnetic layer is carried out, a change of the magnetic structure becomes complicated. This not only causes occurrence of noise, but also makes a coercive force large, so that a switching magnetic field increases.

In order to solve this problem, a magnetoresistive element has been proposed in which the shape of a free layer (ferromagnetic layer) becomes asymmetrical to a easy axis, for example, a parallelogram (refer to Jpn. Pat. Appln. KOKAI Publication No. 11-273337, for example).

According to this technique, the edge domain is small, and thus, a single magnetization zone can be configured over the substantially whole free layer.

On the other hand, a technique of applying a hard bias to an end of a free layer (ferromagnetic layer) to always fix an edge domain has been proposed as a method of preventing a complicated change of a magnetic structure of a ferromagnetic layer at the time of switching (refer to U.S. Pat. No. 5,748,524, for example).

In addition, there has been proposed a technique of newly adding a portion which protrudes in a direction vertical to an easy axis direction to a rectangular free layer (ferromagnetic layer) to form the shape of the free layer as an H shape or an I shape (refer to U.S. Pat. No. 6,205,053, for example).

In this manner, the shape of the free layer is formed as the H shape or the I shape, whereby it becomes possible to prevent a complicated change of the magnetic structure of the ferromagnetic layer at the time of switching and to reduce a switching magnetic field.

In the meantime, when the size of the ferromagnetic layer becomes small, its coercive force becomes large. The size of the coercive force becomes a milestone of the size of the switching magnetic field required for inverting magnetization. Thus, increasing the coercive force denotes increasing the switching magnetic field of the magnetoresistive element.

Therefore, when the size of the ferromagnetic layer becomes small due to downsizing of the magnetoresistive element, there is a need for a large write current at the time of writing data, which brings an unfavorable result such as increased power consumption or shorter service life of wiring.

From this fact, it is an indispensable object to achieve downsizing of the magnetoresistive element and reduction of the coercive force of the ferromagnetic layer used therefor at the same time in order to practically use a magnetic memory having a large capacity.

In order to solve this problem, a magnetoresistive element in which a free layer is comprised at least two ferromagnetic layers and a nonmagnetic layer disposed therebetween has been proposed (refer to U.S. Pat. No. 5,953,248, for example).

In this case, the two ferromagnetic layers are different from each other in magnetic moment or thickness, and are opposed to each other in magnetization orientation due to anti-ferromagnetic junction. Thus, since the influence due to magnetization is effectively offset from each other, it can be considered that the whole free layer is similar to a ferromagnetic body having small magnetization in the easy axis direction.

When a magnetic field is applied to an orientation opposite to that of small magnetization of the easy axis direction, magnetization of the ferromagnetic layer is inverted while maintaining the anti-ferromagnetic junction. At this time, since a magnetic force line is closed, the influence due to the anti-magnetic field becomes small. In addition, because the switching magnetic field of the free layer depends on the coercive force of the ferromagnetic layer, it becomes possible to invert magnetization in a small switching magnetic field.

In the case where an inter-layered junction is not present between the two ferromagnetic layers, interaction caused by a static magnetic junction occurs due to a leakage magnetic field from these ferromagnetic layers. In this case as well, the switching magnetic field can be reduced (refer to transaction of the 24th Japan Applied Magnetic Society, 12aB-3, 12aB-7, transaction of the 24th Japan Applied Magnetic Society, pp. 26 to 27, for example).

However, in the case where no inter-layered junction is present between the two ferromagnetic layers and only a static magnetic junction exists, the magnetic structure of the ferromagnetic layers becomes unstable. In this case, a rectangular shaped ratio in a hysteresis curve or magnetic resistive curve becomes small, and it becomes difficult to obtain a large magnetic resistive ratio. Thus, this magnetoresistive element is not preferable.

As described above, it becomes an indispensable element to avoid complication and to ensure stability with respect to the magnetization zone of the free layer in order to obtain a large output signal with less noise.

However, in general, a parallelogram-shaped free layer is simple in magnetic structure and is obtained as a substantially single magnetic zone, while the coercive force and switching magnetic field become large.

In addition, the behavior during magnetization inversion can be controlled by adding the hard bias structure for fixing an edge domain to the end of the free layer, and in this case also, the coercive force increases. In addition, since there is a need for addition of the hard bias structure for fixing the edge domain, this structure is not suitable to higher density required for a large capacity memory or the like.

Further, in the H-shaped or I-shaped free layer, there is a need for increasing the portion which protrudes in the direction vertical to the easy axis direction in order to introduce to the maximum an advantageous effect of preventing a complicated change of the magnetic structure of the ferromagnetic layer at the time of switching. In this case, however, the size of the magnetoresistive element substantially increases, and therefore, this structure is not suitable to high integration required for a large capacity memory or the like.

It is an indispensable element to reduce a switching magnetic field in order to achieve a magnetic memory, for example, a magnetic random access memory. However, if the free layer is downsized, for example, if the width of the free layer in the short axis direction becomes in order from several microns to sub-microns, a magnetic structure (edge domain) which is different from a magnetic structure of a magnetic object at the center portion is generated due to the influence of an anti-magnetic field at the end of the free layer (magnetization region).

A switching curve of the MTJ element having the magnetic tunnel junction is important during a data write operation in a magnetic random access memory.

The MTJ element is disposed at a cross portion of two write lines which cross each other. A data write operation is carried out by inverting the magnetization orientation of the MTJ element due to the magnetic field generated by a current supplied to the two write lines. A data write operation for the MTJ element is not carried out in only the magnetic field generated by a current supplied to one of the two write lines.

Therefore, the switching curve is defined by the size of a magnetic field in an easy axis direction and the size of a magnetic field in a hard axis direction which are required for switching (magnetization inversion), on a plane formed by the easy axis and the hard axis of the free layer of the MTJ element.

The switching curve is known as being expressed as an asteroid curve in a single magnetic zone model. The write characteristic substantially depends on the switching curve. Thus, an attempt has been made for deforming the switching curve to significantly obtain a write window or increasing stability of the MTJ element in a half selective state in which only a magnetic field generated by a current flowing to one of the two write lines is applied.

Then, a proposal of deforming the shape of the MTJ element has been made as a method of achieving such a switching curve.

For example, a broad bean type (C-type) MTJ element is provided (refer to Jpn. Pat. Appln. KOKAI Publication No. 2003-78112, for example). The broad bean type MTJ element is featured in that the magnetic structure (magnetization pattern) configures a C-type magnetic zone when the magnetic field in the easy axis direction is small, and that the magnetic structure configures an S-type magnetic zone when the magnetic field in the hard axis is large.

When the magnetic structure configures the C-type magnetic zone, the magnetization orientation of the free layer is hardly inverted, and when the magnetic structure configures the S-type magnetic zone, the magnetization orientation of the free layer is easily inverted. This makes it possible to prevent incorrect writing relevant to the MTJ element in a half selective state, and to lower the coercive force at the time of writing to reduce the switching magnetic field.

In addition to the broad bean type, a cross shape exists as a shape such that the magnetic structure when the magnetic field in the hard magnetic axis direction configures the C-shape magnetic zone. The cross-shaped MTJ element is featured in that the magnetic structure when the magnetic field in the hard axis direction is small configures two C-shape magnetic zone. In the cross-shaped MTJ element, a switching magnetic field in a direction forming 45 degrees with respect to the easy axis or hard axis can be reduced.

However, in any case, the existing MTJ element having a broad bean shape or a cross shape cannot attain a write characteristic which can fully satisfy the requirements. Further, there is a demand for the shape capable of providing a wide write window and stabilizing the state of the MTJ element in a half selective state.

BRIEF SUMMARY OF THE INVENTION

A magnetoresistive element according to an aspect of the present invention includes a stacked structure comprised first and second ferromagnetic layers and a nonmagnetic layer disposed between the ferromagnetic layers, wherein a planar shape of the magnetoresistive element has an approximate shape formed by combining two or more characters C with each other.

A magnetoresistive element according to an aspect of the present invention includes a stacked structure comprised first and second ferromagnetic layers and a nonmagnetic layer disposed between the ferromagnetic layers, wherein a planar shape of the magnetoresistive element has an approximate shape formed by crossing two parallelograms each other.

A magnetoresistive element according to an aspect of the present invention includes a stacked structure comprised first and second ferromagnetic layers and a nonmagnetic layer disposed between the ferromagnetic layers, wherein a planar shape of the magnetoresistive element has a C shape, at least one of the first and second ferromagnetic layers comprises two magnetic layers, and magnetization of the two magnetic layers are oriented to be opposite to each other.

A magnetoresistive element according to an aspect of the present invention includes a stacked structure comprised first and second ferromagnetic layers and a nonmagnetic layer disposed between the ferromagnetic layers, wherein a planar shape of the magnetoresistive element has an extension portion which extends in a first direction and a protrusion portion which protrudes from a side face of the extension portion in a second direction vertical to the first direction, at least one of the first and second ferromagnetic layers comprises two magnetic layers, and magnetization of the two magnetic layers are oriented to be opposite to each other.

A magnetoresistive element according to an aspect of the present invention includes a stacked structure comprised first and second ferromagnetic layers and a nonmagnetic layer disposed between the ferromagnetic layers, wherein at least one of the first and second ferromagnetic layers comprises: a third ferromagnetic layer having magnetic anisotropy in a first direction; and a fourth ferromagnetic layer stacked on the third ferromagnetic layer, the fourth ferromagnetic layer having magnetic anisotropy in a third direction which is different from the first direction and a second direction opposite to the first direction.

A magnetoresistive element according to an aspect of the present invention includes a stacked structure comprised first and second ferromagnetic layers and a nonmagnetic layer disposed between the ferromagnetic layers, wherein at least one of the first and second ferromagnetic layers comprises: a first portion having magnetic anisotropy in a first direction; and a second portion physically combined with the first portion, the second portion having magnetic anisotropy in a third direction which is different from the first direction and a second direction opposite to the first direction.

BRIEF DESCRIPTION OF THE SEVERAL VIEWS OF THE DRAWING

FIG. 17 is a view showing a structure of a free layer of a magnetoresistive element according to a seventh embodiment;

FIG. 18 is a view showing the structure of the free layer of the magnetoresistive element according to the seventh embodiment;

FIG. 19 is a view showing the structure of the free layer of the magnetoresistive element according to the seventh embodiment;

FIG. 43 is a view showing a sectional structure of a magnetoresistive element according to an example of the invention;

FIG. 44 is a view showing a sectional structure of a magnetoresistive element according to an example of the invention;

FIG. 45 is a view showing a structural example 1 of a free layer of a magnetoresistive element according to a fifteenth embodiment;

FIG. 46 is a view showing a structural example 2 of the free layer of the magnetoresistive element according to the fifteenth embodiment;

FIG. 47 is a switching curve showing the magnetoresistive element according to the fourteenth and fifteenth embodiments;

DETAILED DESCRIPTION OF THE INVENTION

Figure 1:
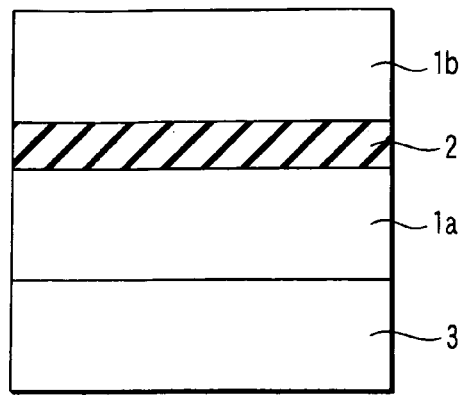
FIG. 1 is a view showing a sectional structure of a magnetoresistive element according to an example of the present invention.

A magnetoresistive element of an aspect of the present invention will be described below in detail with reference to the accompanying drawings.

1. General Description

An example of the present invention relates to a magnetoresistive element having a shape suitable to carry out a so-called C-S switching in which residual magnetization configures a C-shape magnetic zone and a magnetization pattern of a free layer is changed from the C-shape magnetic zone to an S-shape magnetic zone at the time of switching (magnetization inversion).

In C-S switching, a magnetic pattern of a free layer of deselected and half-selected magneto resistive elements which do not carry out magnetization inversion configures a C-shape magnetic zone which requires a large switching magnetic field for magnetization inversion. On the other hand, a magnetization pattern of a free layer of a selected magnetoresistive element which carries out magnetization inversion is changed from the C-shape magnetic zone to the S-shape magnetic zone capable of carrying out magnetization inversion in a small switching magnetic field. Thus, it becomes possible to improve a write disturbance and to achieve prevention of a write error and improvement of selectivity.

In order to carry out such C-S switching, specifically, in the case where magnetization inversion is carried out by a composite magnetic field of a magnetic field of a magnetoresistive element in an easy axis direction and a magnetic field in a hard axis direction, a planar shape or structure of a magnetoresistive element may be proposed in which the magnetization pattern of the free layer can maintain two or more C-shape magnetic zones in a region in which the magnetic field in the hard axis direction is zero or small.

(1) Planar Shape

In the example of the invention, a planar shape of the magnetoresistive element is comprised an approximate shape obtained by combining two or more characters C with each other. For example, in the case where these two or more characters C are oriented in the same direction, the whole shape of the magnetoresistive element is comprised the shape of character E or character M, or in an approximate shape approximate to a shape formed by combining a plurality of characters E or a plurality of characters M with each other (E shape, M shape, continuous E shape, and continuous M shape).

For example, in the case where these two or more characters C are oriented in different directions from each other, the whole shape of the magnetoresistive element is comprised an approximate shape such that the characters C are combined with each other at backs thereof, in the shape of character Z, or in an approximate shape approximate to a shape formed by further combining these characters Z with each other in plurality (modified H shape, fancy Z shape, continuous modified H shape, and continuous fancy Z shape).

Here, character H is called modified H shape because two vertical lines of the character H is comprised an approximate shape which is warped in an opposite direction. In addition, character Z is called a fancy Z shape because a planar shape thereof is formed an approximate shape having a depressed portion (fancy portion) at the center portion of the character Z in detail.

Further, a planer shape formed by crossing two or more parallelograms can configure two or more C-shape magnetic zones, and thus, is comprised a shape suitable to carry out C-S switching. Moreover, since in this case, two or more parallelograms are combined with each other instead of two or more rectangles, a distal end of a free layer of the magnetoresistive element is comprised a tapered shape which is obliquely cut off.

Therefore, the magnetization pattern of the free layer of the deselected magnetoresistive element can maintain two or more C-shape magnetic zones effectively at the time of switching, which makes it possible to achieve prevention of a write error and improvement of selectivity.

In this way, in the magnetoresistive element according to the example of the invention, the residual magnetization and the magnetization pattern in the case where no magnetization inversion is carried out each have a planar shape such that they configure two or more C-shape magnetic zones. Therefore, by means of C-S switching, a write disturbance can be improved, and prevention of a write error and improvement of selectivity can be achieved.

At least one of the free layer and the pinned layer of the magnetoresistive element may be comprised two different types of ferromagnetic layers (soft layer and hard layer) in order to increase a difference between a value of a switching magnetic field of a wide write window, i.e., of the selected magnetoresistive element which carries out magnetization inversion and a value of a switching magnetic field of a deselected magnetoresistive element which does not carry out magnetization inversion.

In addition, at least one of the free layer and the pinned layer of the magnetoresistive element may be comprised two different types of ferromagnetic layers (soft layer and hard layer) and a nonmagnetic layer disposed between the different types of ferromagnetic layers.

In this case, the two different types of ferromagnetic layers are combined with each other in a ferromagnetic manner or are combined with each other in an anti-ferromagnetic manner, whereby an asteroid curve extending lengthwise in the hard axis direction can be obtained in a single magnetic zone model. Thus, a wide write window can be achieved by combining such a structure and C-S switching with each other.

The "two different types" used here denotes "different magnetic characteristics", and the different magnetic characteristics can be achieved by, for example, the film thickness, film forming condition, material, and structure of the ferromagnetic layer (soft layer and hard layer).

(2) Structure

In the example of the invention, a structure of the magnetoresistive element is provided as a structure for combining a portion having weak magnetic anisotropy in the hard axis direction with respect to a general magnetoresistive element having magnetic anisotropy in the easy axis direction. Such a structure is provided because the magnetic anisotropy in the hard axis direction influences formation of a magnetic zone at an end of the magnetoresistive element.

For example, with a ferromagnetic layer (first portion) of the magnetoresistive element having magnetic anisotropy in a first direction (easy axis direction) such as a broad bean shape (C shape) or cross shape, a ferromagnetic layer (second portion) having magnetic anisotropy in a third direction which is different from a first direction and a second direction opposite to the first direction is combined.

As a combining method, the first and second portions may be combined with each other in the same plane or the first and second portions may be combined with each other in a laminate manner. In the case of lamination, the first and second portions are comprised the same shape. Further, both of these portions are directly combined with each other such that a ferromagnetic junction or an anti-ferromagnetic junction occurs between the two portions. The number of ferromagnetic layers to be laminated is two or more.

In the case where a nonmagnetic layer is disposed between the first and second portions, an inter-layered junction occurs between these portions in addition to the ferromagnetic junction or anti-ferromagnetic junction. The occurrence of the inter-layered junction is convenient when the magnetization orientations of the first and second portions are made different from each other.

The third direction can easily produce a plurality of C-shape magnetic zones more if the direction is oriented in an angle direction ranging from 30° to 90° with respect to the first or second direction, for example, in a direction of 90° with respect to the first and second directions.

The thickness of the free layer of the magnetoresistive element may be set to a value in a range of 0.1 nm or more and 50 nm or less.

In this manner, the free layer of the magnetoresistive element according to the example of the invention has a structure that the magnetization patterns in the case where the residual magnetization and magnetization inversion are not carried out can configure a plurality of C-shape magnetic zones, respectively. Therefore, by means of C-S switching, a write disturbance can be improved, and prevention of a write error and improvement of selectivity can be achieved.

In addition, the free layer is comprised a stacked structure made of a plurality of ferromagnetic layers, thereby making it possible to increase a difference between a value of an inverted magnetic field of a wide write window, i.e., of a selected magnetoresistive element which carries out magnetization inversion and a value of an inverted magnetic field of a deselected magnetoresistive element which does not carry out magnetization inversion.

Figure 24:
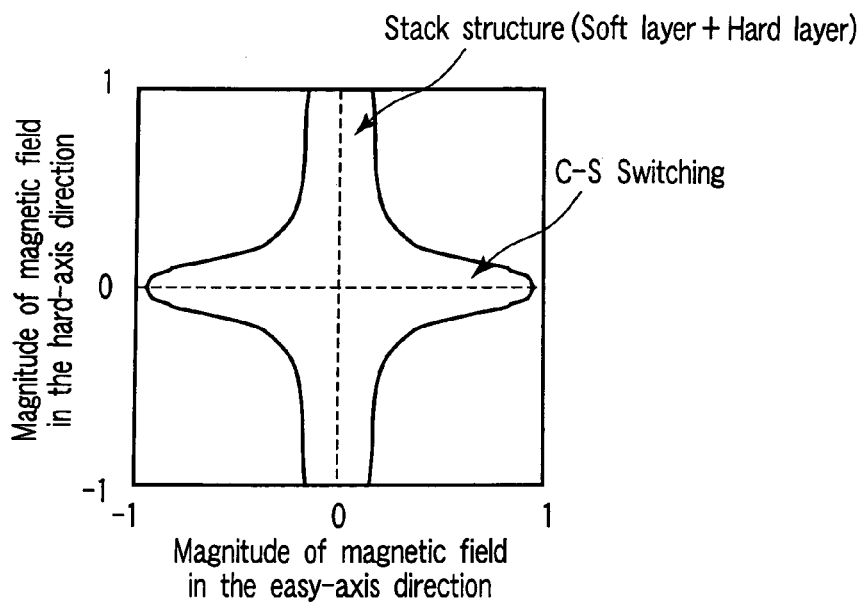
FIG. 24 is a view showing a switching curve of the magnetoresistive element according to the seventh embodiment.

That is, a plurality of ferromagnetic layers are combined with each other in a ferromagnetic manner or are combined with each other in an anti-ferromagnetic manner, whereby an asteroid curve extending lengthwise in the hard axis direction as shown in FIG. 24 can be obtained in a single magnetic zone model. Consequently, a wide write window can be achieved by combining such a structure and C-S switching with each other.

2. Embodiments

Now, a description will be given with respect to a plurality of embodiments which seem to be optimal when carrying out an example of the present invention.

(1) Basic Structure of MTJ Element

A magnetic memory element which is a subject of an example of the present invention is a magnetoresistive element having a magneto resistive effect, for example, a magneto tunnel junction (MTJ) element having a tunnel magneto resistive effect. First, a basic structure of the MTJ element will be described here.

The magnetic tunnel junction of the MTJ element, as shown in FIG. 1, is comprised two ferromagnetic layers 1a and 1b and a thin insulating layer (nonmagnetic layer) 2 sandwiched between these two ferromagnetic layers. One of the ferromagnetic layers is a pinned layer 1a to which a magnetization pattern (magnetization orientation) has been fixed by an anti-ferromagnetic layer (pin layer) 3, and the other one is a free layer 1b in which a magnetization pattern (magnetization orientation) changes according to data. The insulating layer 2 disposed between the pinned layer 1a and the free layer 1b is called a tunnel barrier.

In general, the ferromagnetic layers 1a and 1b are comprised Ni, Fe, Co, or alloy of these metals, or an amorphous magnetic object such as CoFeB. In addition, an Mn oxide such as $LaMnO_3$ or a half metal represented by a Whistler alloy such as NiMnSb may be used as the ferromagnetic layers 1a and 1b.

Each of the ferromagnetic layers 1a and 1b is comprised accordance with a sputtering technique or an MBE technique, and the thickness of each layer is set to a value in a range of 0.1 nm or more and 50 nm or less.

The insulating layer 2 is comprised, for example, an oxide such as $AlO_x$ or MgO, and a nitride such as AlN. Further, with respect to the insulating layer 2, a semiconductor such as Si or Ge may be used instead of these oxide and nitride.

The thickness of the insulating layer 2 is set to be 10 nm or less. The thickness of the insulating layer 2 is preferably as thin as possible. In recent years, the insulating layer 2 is set to be 2 nm or less, and preferably, 1 nm or less.

The example of the invention relates to a planer shape or structure of the magnetoresistive element, and specifically, relates to a planer shape or structure of the free layer of the magnetoresistive element, as described in the above General Description section.

That is, first, in the example of the invention, the planer shape of the free shape has a shape such that two or more characters C are combined with each other or in a shape such that two parallelograms are crossed each other. Secondly, in the example of the invention, the free layer of the magnetoresistive element is comprised a first portion at which magnetization orientation is defined as a first direction (easy axis direction) and a second portion combined to the first portion, magnetization orientation of the second portion being defined as a third direction different from the first direction and a second direction opposite the first direction.

Therefore, a plurality of embodiments below sequentially describe a planar shape and structure of a free layer by sampling only the free layer of the magnetoresistive element.

The planer shape of the whole magnetoresistive element including a pinned layer and a free layer may be identical to that of the free layer or may be different from that of the free layer.

(2) First Embodiment

Figure 2:
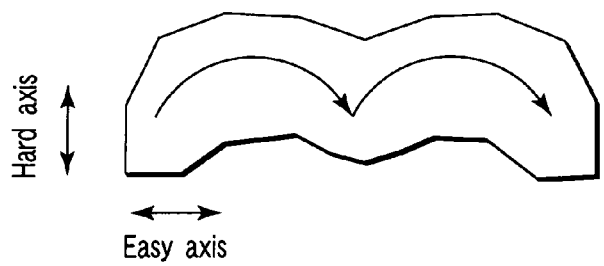
FIG. 2 is a view showing a planar shape of a free layer of a magnetoresistive element according to a first embodiment.

FIG. 2 shows a planer shape of a free layer of a magnetoresistive element according to a first embodiment of the present invention.

In this embodiment, the free layer of the magnetoresistive element has a planar shape formed by combining two characters C with each other. Specifically, the two characters C are disposed to be oriented in the same direction, to be oriented on a curved face in the hard axis direction, and to be adjacent to each other in the easy axis direction. The two characters C each have a planer shape approximate to character E or character M as a whole.

In this case, the residual magnetization of the free layer of the magnetoresistive element and the magnetization pattern in a region in which the magnetic field in the hard axis direction is zero or small each are comprised two C shape magnetic zones.

Figure 3:
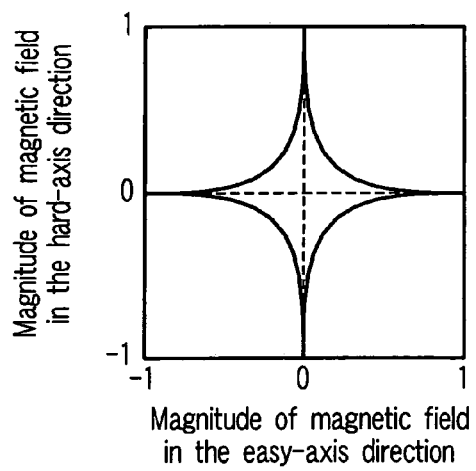
FIG. 3 is a view showing a switching curve of the magnetoresistive element of FIG. 2.
Figure 4:
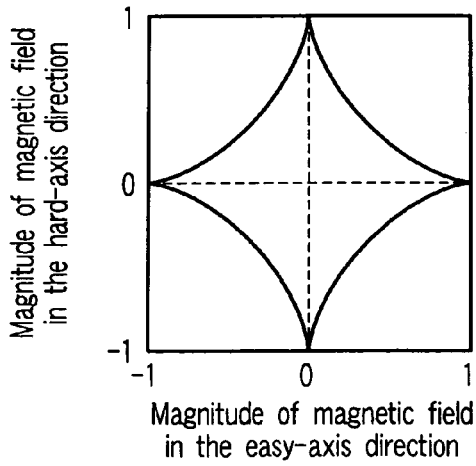
FIG. 4 is a view showing a switching curve obtained in a single magnetic zone model.

FIG. 3 shows a switching curve of the magnetoresistive element having the planer shape of FIG. 2. FIG. 4 shows a switching curve (asteroid curve) obtained in a single magnetic zone model.

In comparison between FIGS. 3 and 4, the switching curve of the magnetoresistive element having the planar shape of FIG. 2 is depressed more significantly than that obtained in the single magnetic zone model in a region in which both of the magnetic field in the easy axis direction and the magnetic field in the hard axis direction exist. This more significant depression denotes that the switching magnetic field (inverted magnetic field) is small.

Therefore, according to the magnetoresistive element having the planar shape of FIG. 2, in a region in which the magnetic field in the hard axis direction is zero or small (in the deselected case), the switching magnetic field is increased in size, whereby a write error can be prevented. In addition, in a region in which both of the magnetic field in the easy axis direction and the magnetic field in the hard axis direction exist (in the selected case), the switching magnetic field is reduced in size, so that it is possible to achieve low current consumption due to the reduction of a write current.

The size of the depression depends on the thickness of the free layer.

The depression itself of the switching curve can be formed by setting the thickness of the free layer to be 50 nm or less. However, considering high integration or low current consumption of a memory element in recent years, the thickness of the free layer is preferably set to a value in a range of 2 nm or more and 20 nm or less, and further preferably, in a range of 3 nm or more and 14 nm or less.

It is preferable that an aspect ratio of the planar shape of the free layer is set such that vertical direction (hard axis direction): horizontal direction (easy axis) is obtained as a value ranging from 1:1 to 1:10. In actuality, the aspect ratio is set to a value ranging between 1:2 and 1:4 (approximately 1:2 in the present embodiment) from the viewpoint of high integration of the memory element or the like.

(3) Second Embodiment

Figure 5:
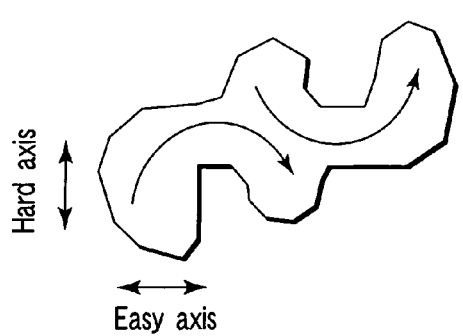
FIG. 5 is a view showing a planar shape of a free layer of a magnetoresistive element according to a second embodiment.

FIG. 5 shows a planar shape of a free layer of a magnetoresistive element according to a second embodiment of the present invention.

In this embodiment, as in the first embodiment, the free layer of the magnetoresistive element has a planar shape formed by combining two characters C with each other. However, the two characters C are oriented in different directions from each other, unlike the first embodiment. Specifically, the two characters C are combined with each other at their back, and are oriented in opposite directions to each other. Further, a curve face of the character C is comprised a shape such that the curved face is oriented in the hard axis direction, and is slightly shifted in the easy axis direction. The two characters C each have a planar shape approximate to character Z as a whole.

In this case as well, the residual magnetization of the free layer of the magnetoresistive element and a magnetization pattern in a region in which the magnetization field in the hard axis direction is zero or small each are comprised two C shape magnetic zones.

Figure 6:
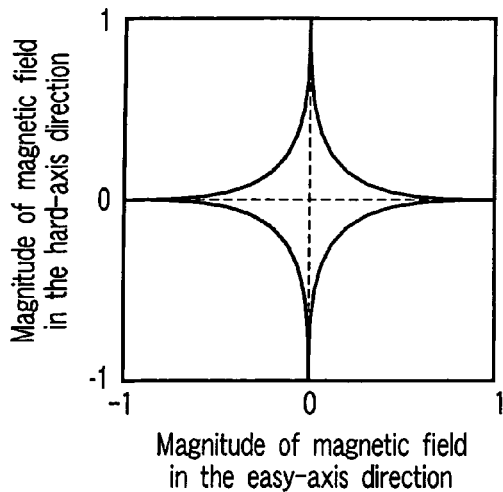
FIG. 6 is a view showing a switching curve of the magnetoresistive element of FIG. 5.

FIG. 6 shows a switching curve of the magnetoresistive element having the planer shape of FIG. 5.

The switching curve is substantially identical to that of FIG. 3. That is, in a region in which both of the magnetic field in the easy axis direction and the magnetic field in the hard axis direction exist, this switching curve is depressed more significantly than that obtained in the single magnetic zone model shown in FIG. 4.

Therefore, according to the magnetoresistive element having the planar shape of FIG. 5, in a region in which the magnetic field in the hard axis direction is zero or small (in the deselected case), the switching magnetic field is increased in size, whereby a write error can be prevented. In addition, in a region in which both of the magnetic field in the easy axis direction and the magnetic field in the hard axis direction exist (in the selected case), the switching magnetic field is reduced in size, so that it is possible to achieve low current consumption due to the reduction of a write current.

The embodiment is identical to the first embodiment in that the size of depression in the switching curve depends on the thickness of the free layer. That is, the depression itself of the switching curve can be formed by setting the thickness of the free layer to be 50 nm or less. However, the thickness of an actual free layer is set to a value in a range of 2 nm or more and 20 nm or less, and further, is set to a value in a range of 3 nm or more and 14 nm or less.

An aspect ratio of the planar shape of the free layer, as in the first embodiment, is set such that vertical direction (hard axis direction): horizontal direction (easy axis direction) is obtained as a value ranging from 1:1 to 1:10. In actuality, the aspect ratio is set to a value ranging from 1:2 to 1:4 (approximately 1:2 in the present embodiment).

(4) Third Embodiment

Figure 7:
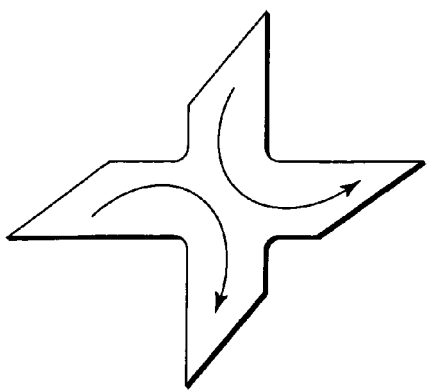
FIG. 7 is a view showing a planar shape of a free layer of a magnetoresistive element according to a third embodiment.

FIG. 7 shows a planar shape of a free layer of a magnetoresistive element according to a third embodiment of the present invention.

In this embodiment as well, the free layer of the magnetoresistive element has a planar shape formed by combining two characters C with each other. The two characters C are oriented in different directions from each other, are combined with each other at their back, and are oriented in opposite directions to each other. In other words, the free layer of the embodiment has a shape such that two parallelograms are crossed each other.

Since the free layer has the shape such that the two parallelograms are crossed each other, the shape of a distal end of the free layer is comprised a tapered shape which is obliquely cut off instead of a rectangle.

An angle of the distal end (acute angle portion) of the free layer is set to be a value in a range of 20° or more and less than 90°.

The angle of the distal end of the free layer denotes an angle at a portion which corresponds to a mask used for processing the free layer. With respect to the free layer to be actually formed, the distal end is rounded with a certain curvature instead of an acute angle depending on the precision of photolithography or processing precision.

In order to determine this angle from the shape of the actually formed free layer, for example, an approximately linear portion obtained as an edge of the free layer is extended straight way, and a cross angle of a portion at which straight lines cross is defined as an angle of the distal end of the free layer.

In such a case as well, the remaining magnetization of the free layer of the magnetoresistive element and the magnetization pattern in a region in which the magnetic field in the hard axis direction is zero or small each are comprised two C-shape magnetic zones.

Figure 8:
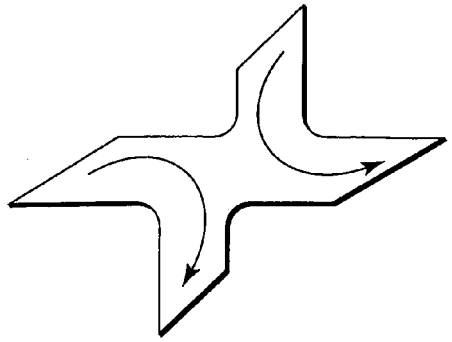
FIG. 8 is a view showing a modified example of the magnetoresistive element of FIG. 7.
Figure 9:
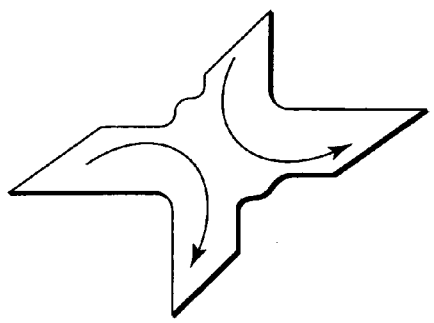
FIG. 9 is a view showing a modified example of the magnetoresistive element of FIG. 7.

In the embodiment, the planer shape of the free layer of the magnetoresistive element is symmetrical to a center point. However, for example, as shown in FIGS. 8 and 9, the planar shape may be comprised the shape which is asymmetrical to the center point and two C-shape magnetic zones may be easily formed.

Figure 10:
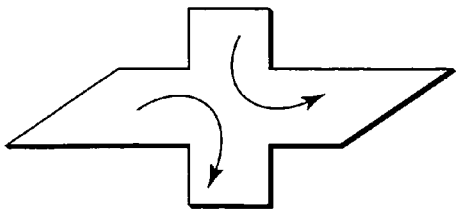
FIG. 10 is a view showing a modified example of the magnetoresistive element of FIG. 7.
Figure 11:
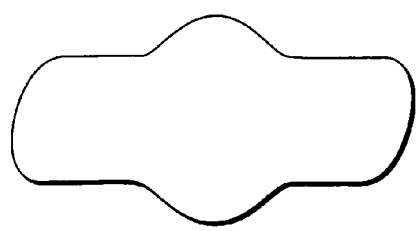
FIG. 11 is a view showing a modified example of the magnetoresistive element of FIG. 7.
Figure 12:
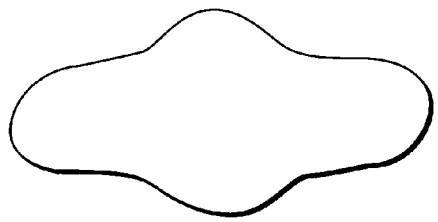
FIG. 12 is a view showing a modified example of the magnetoresistive element of FIG. 7.

In addition, as shown in FIG. 10, the planar shape may be comprised an approximate shape such that one parallelogram and one rectangle are crossed each other. When the shape of FIG. 10 is actually applied to the MTJ element, for example, the applied shape is comprised an approximate shape as shown in FIGS. 11 and 12.

Switching curves of magnetoresistive elements having planar shapes of FIGS. 7 to 12 are obtained as the curve having the depression as shown in FIG. 6, for example.

Therefore, also in the magnetoresistive elements having the planar shapes of FIGS. 7 to 12, the switching magnetic field is increased in size, thereby making it possible to prevent a write error in a region in which the magnetic field in the hard axis direction is zero or small (in the deselected case). Additionally, the switching magnetic field is reduced in size, thereby making it possible to achieve low current consumption due to the reduction of a write current in a region in which both of the magnetic field in the easy axis direction and the magnetic field in the hard axis direction exist (in the selected case).

Since the thickness and aspect ratio of the free layer are identical to those according to the first embodiment, a duplicate description is omitted here.

(5) Fourth Embodiment

Figure 13:
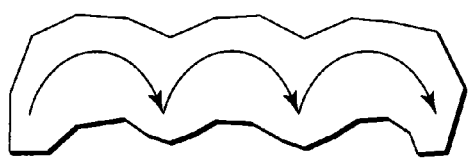
FIG. 13 is a view showing a planar shape of a free layer of a magnetoresistive element according to a fourth embodiment.

FIG. 13 shows a planar shape of a free layer of a magnetic layer of a magnetoresistive element according to a fourth embodiment of the present invention.

In this embodiment, the free layer of the magnetoresistive element has a planer shape formed by combining three characters C. Specifically, the three characters C are disposed to be oriented in the same direction, to be oriented on a curved face in the hard axis direction, and to be adjacent to one another in the easy axis direction. The three characters C each have a planar shape approximate to a shape in which a plurality of characters E or a plurality of characters M are combined.

In this case, the residual magnetization of the free layer of the magnetoresistive element and the magnetization pattern in a region in which the magnetic field in the hard axis direction is zero or small each are comprised three C-shape magnetic zones.

The free layer of the magnetoresistive element may be comprised a planar shape such that more than three characters C are combined.

Figure 14:
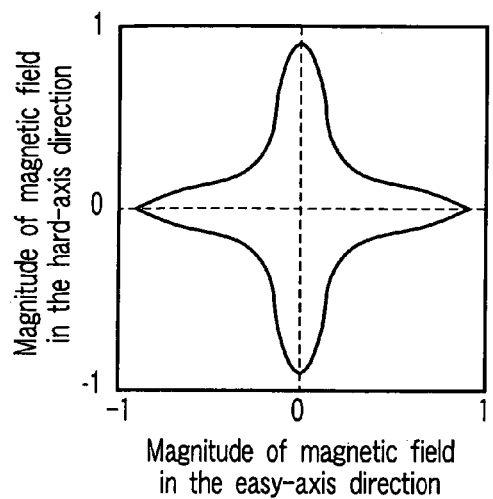
FIG. 14 is a view showing a switching curve of the magnetoresistive element of FIG. 13.

FIG. 14 shows a switching curve of the magnetoresistive element having the planar shape of FIG. 13.

Also in the magnetoresistive element having the planar shape of FIG. 13, the switching magnetic field is increased in size, thereby making it possible to prevent a write error in a region in which the magnetic field in the hard axis direction is zero or small (in the deselected case). In addition, in a region in which both of the magnetic field in the easy axis direction and the magnetic field in the hard axis direction exist (in the selected case), the switching magnetic field is reduced in size, so that it is possible to achieve low current consumption due to the reduction of a write current.

Since the thickness and aspect ratio of the free layer are identical to those according to the first embodiment, a duplicate description is omitted here.

(6) Fifth Embodiment

Figure 15:
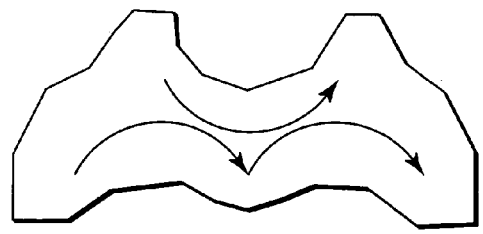
FIG. 15 is a view showing a planar shape of a free layer of a magnetoresistive element according to a fifth embodiment.

FIG. 15 shows a planar shape of a free layer of a magnetoresistive element according to a fifth embodiment of the present invention.

In this embodiment, the free layer of the magnetoresistive element has a planar shape formed by combining three characters C. Specifically, the free layer has a planar shape formed by combining a specific single character C with a character C oriented in the same direction and a character C oriented in a different direction with respect to the specific single character C.

In this case, the residual magnetization of the free layer of the magnetoresistive element and the magnetization pattern in a region in which the magnetic field in the hard axis direction is zero or small each are comprised three C-shape magnetic zones.

Also in the magnetoresistive element having the planar shape of FIG. 15, the switching magnetic field is increased in size, whereby a write error can be prevented in a region in which the magnetic field in the hard axis direction is zero or small (in the deselected case). In addition, in a region in which both of the magnetic field in the easy axis direction and the magnetic field in the hard axis direction exist (in the selected case), the switching magnetic field is reduced in size, so that it is possible to achieve low current consumption due to the reduction of a write current.

Since the thickness of aspect ratio of the free layer are identical to those according to the first embodiment, a duplicate description is omitted here.

(7) Sixth Embodiment

Figure 16:
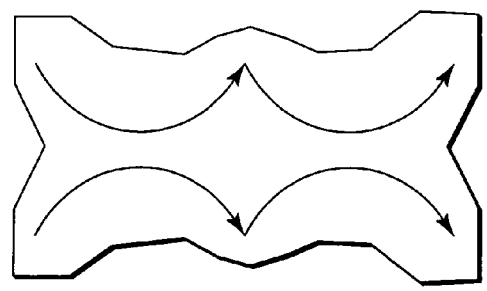
FIG. 16 is a view showing a planar shape of a free layer of a magnetoresistive element according to a sixth embodiment.

FIG. 16 shows a planar shape of a free layer of a magnetoresistive element according to a sixth embodiment of the present invention.

In this embodiment, the free layer of the magnetoresistive element has a planar shape formed by combining four characters C are combined. Specifically, the free layer has a planar shape formed by combining a specific single character C with a character C oriented in the same direction and characters C oriented in a different direction with respect to the specific single character C. The four characters C each have a shape approximate to character H as a whole.

In this case, the residual magnetization of the free layer of the magnetoresistive element and the magnetization pattern in a region in which the magnetic field in the hard axis direction is zero or small each are comprised four C-shape magnetic zones.

Also in the magnetoresistive element having the planar shape of FIG. 16, the switching magnetic field is increased in size, thereby making it possible to prevent a write error in a region in which the magnetic field in the hard axis direction is zero or small (in the deselected case). In addition, in a region in which both of the magnetic field in the easy axis direction and the magnetic field in the hard axis direction exists (in the selected case), the switching magnetic field is reduced in size, whereby it is possible to achieve low current consumption due to the reduction of a write current.

Since the thickness and aspect ratio of the free layer are identical to those according to the first embodiment, a duplicate description is omitted here.

(8) Seventh Embodiment

The present embodiment relates to a structure of a ferromagnetic layer (free layer or pinned layer) of the magnetoresistive element according to the first to sixth embodiments described above, for example.

For example, the ferromagnetic layer obtained as a free layer of the magnetoresistive element is comprised two different types of magnetic layers, i.e., a soft magnetic layer (soft layer) and a hard magnetic layer (hard layer). When the free layer is provided as a stacked structure of such a soft magnetic layer and a hard magnetic layer, a switching curve significantly extends in the hard axis direction. By applying this property to the example of the invention, for example, a switching curve as shown in FIG. 24 can be obtained.

In such a switching curve, the magnetization state of a memory element in a so-called half selected state can be stabilized, and a write error can be effectively prevented. In addition, in this case, the switching curve is sufficiently spaced from the hard axis. Thus, a shift effect of the switching curve caused by the leakage magnetic field from a nail junction or a pinned layer is reduced in size, and a dispersion of the switching curves is minimized.

FIGS. 17 and 18 each show a first example of a planar shape of a free layer in a magnetoresistive element according to a seventh embodiment.

This example is featured in that the free layer of the magnetoresistive element of FIG. 2 is comprised a soft magnetic layer (soft layer) and a hard magnetic layer (hard layer).

The soft magnetic layer and the hard magnetic layer are combined with each other in a ferromagnetic manner or are combined with each other in an anti-ferromagnetic manner. The magnetization in the soft magnetic layer and the magnetization in the hard magnetic layer may be oriented in the same direction as shown in FIG. 17, or may be oriented in opposite directions to each other as shown in FIG. 18.

FIG. 19 shows a second example of the planar shape of the free layer in the magnetoresistive element according to the seventh embodiment.

This example is featured in that a free layer of a C-shape magnetoresistive element having a planar shape made of one character C is comprised a soft magnetic layer (soft layer) and a hard magnetic layer (hard layer).

The soft magnetic layer and the hard magnetic layer are combined with each other in a ferromagnetic manner or are combined with each other in an anti-ferromagnetic manner.

In the case of this example, the magnetization in the soft magnetic layer and the magnetization in the hard magnetic layer can be oriented in the same direction. However, they may be oriented in opposite directions to each other, as shown in the figure.

Figure 20:
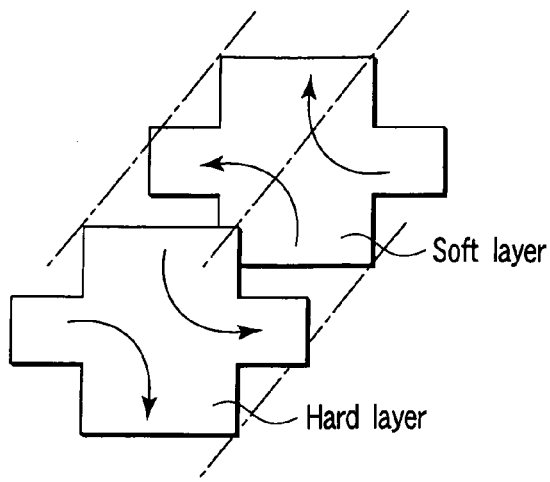
FIG. 20 is a view showing the structure of the free layer of the magnetoresistive element according to the seventh embodiment.

FIG. 20 shows a third example of the planar shape of the free layer in the magnetoresistive element according to the seventh embodiment.

This example is featured in that a free layer of a cross-shaped magnetoresistive element is comprised a soft magnetic layer (soft layer) and a hard magnetic layer (hard layer).

The soft magnetic layer and the hard magnetic layer are combined with each other in a ferromagnetic manner or are combined with each other in an anti-ferromagnetic manner.

In the case of this example as well, the magnetization in the soft magnetic layer and the magnetization in the hard magnetic layer can be oriented in the same direction. However, they may be oriented in opposite directions to each other, as shown in the figure.

Now, a description will be given with respect to a specific structure of a ferromagnetic layer made of a soft magnetic layer and a hard magnetic layer.

Figure 21:
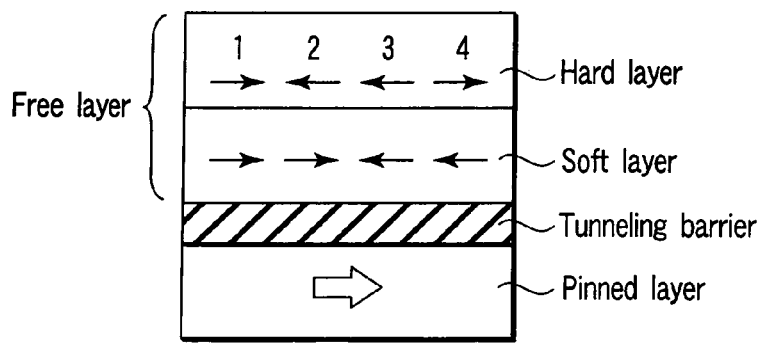
FIG. 21 is a view showing a sectional structure of the magnetoresistive element according to the seventh embodiment.

FIG. 21 shows an example in which the free layer of the magnetoresistive element is comprised a soft magnetic layer and a hard magnetic layer.

The arrows of the soft magnetic layer (soft layer) and the hard magnetic layer (hard layer) indicate patterns in magnetization orientation. Four patterns exist as indicated by numbers 1 to 4. The state (0 or 1) of the magnetoresistive element is determined in magnetization orientation of the pinned layer and magnetization orientation of the soft magnetic layer.

Figure 22:
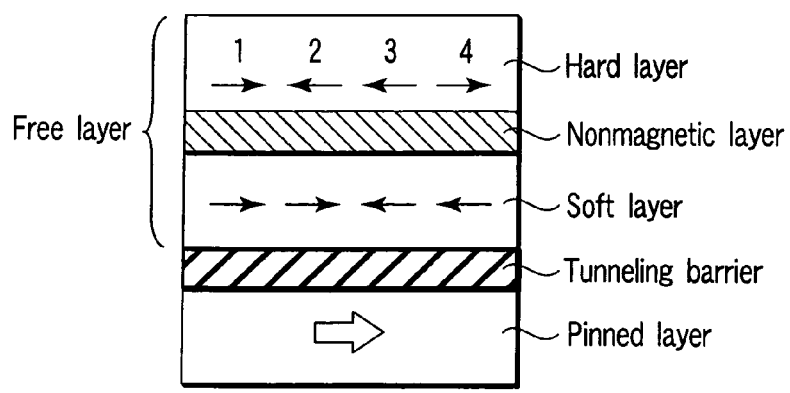
FIG. 22 is a view showing the sectional structure of the magnetoresistive element according to the seventh embodiment.
Figure 23:
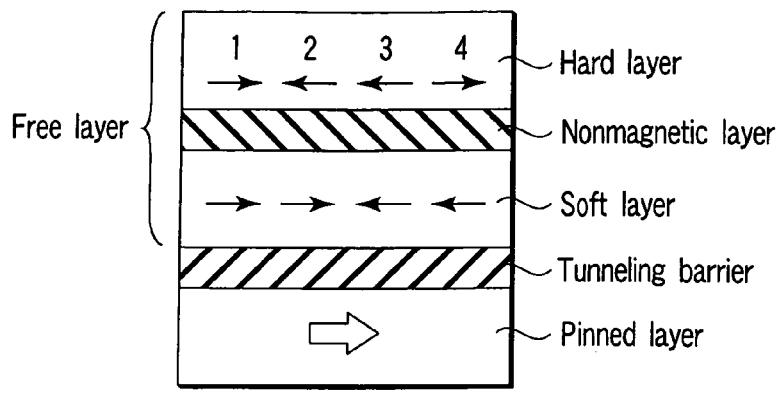
FIG. 23 is a view showing the sectional structure of the magnetoresistive element according to the seventh embodiment.

FIGS. 22 and 23 each show an example in which the free layer of the magnetoresistive element is comprised a soft magnetic layer, a nonmagnetic layer, and a hard magnetic layer.

Numbers 1 to 4 indicate four patterns of magnetization orientations of the soft magnetic layer (soft layer) and the hard magnetic layer (hard layer).

The nonmagnetic layer is disposed between the two ferromagnetic layers (soft magnetic layer and hard magnetic layer), whereby a junction called an inter-layered junction occurs between these ferromagnetic layers. The inter-layered junction generates a ferromagnetic junction or an anti-ferromagnetic junction between the two ferromagnetic layers depending on the thickness of the nonmagnetic layer.

For example, in the case where an anti-ferromagnetic junction occurs between the two ferromagnetic layers, the switching curve significantly extends in the hard axis direction, as shown in FIG. 24.

In such a switching curve, the magnetization state of the memory element in a so-called half selected state can be stabilized, and a write error can be effectively prevented. In this case, the switching curve is sufficiently spaced from the hard axis. Thus, a shift effect of the switching curve caused by the leakage magnetic field from a nail junction or a pinned layer is reduced in size, and a dispersion of the switching curves is minimized.

FIG. 22 shows an example of a case in which a nonmagnetic layer is an electrically conductive element, and FIG. 23 shows an example of a case in which a nonmagnetic layer is an insulating element.

In the case where an electrically conductive element is used as a nonmagnetic layer, for example, a nonmagnetic metal such as Cu, Ag, Au, Ti, Ta, Ru, Re, or Rh is used as the nonmagnetic layer. In addition, in the case where an insulating element is used as a nonmagnetic layer, for example, an oxide insulating element such as AlO or MgO, or a nitride such as AlN is used as the nonmagnetic layer.

The arrows of the soft magnetic layer (soft layer) and the hard magnetic layer (hard layer) indicate patterns in magnetization orientation, and four patterns exist. The state (0 or 1) of the magnetoresistive element is determined in magnetization orientation of the pinned layer and magnetization orientation of the soft magnetic layer.

(9) Eighth Embodiment

Figure 25:
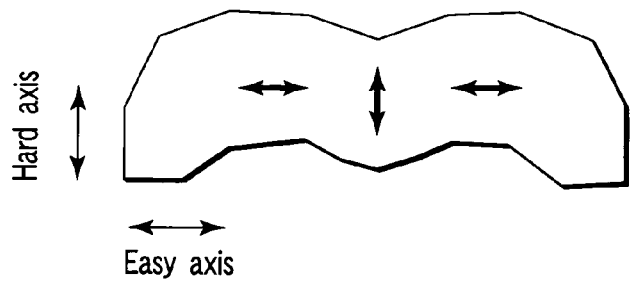
FIG. 25 is a view showing a free layer of a magnetoresistive element according to an eighth embodiment.

FIG. 25 shows a free layer of a magnetoresistive element according to an eighth embodiment of the present invention.

In this embodiment, the free layer of the magnetoresistive element has an approximate shape formed by combining two characters C with each other. Here, the free layer, as indicated by the arrow, is comprised first portions having magnetic anisotropy in the easy axis direction and a second portion having magnetic anisotropy in the hard axis direction. (The orientation indicated by the arrow represents magnetic anisotropy. Hereinafter, this applies for all the embodiments.)

The magnetic anisotropy of the free layer can be easily adjusted by setting the laminating conditions when the ferromagnetic layer of the free layer is laminated.

In addition, assumed that the magnetic anisotropy in the easy axis direction is parallel to the easy axis, the magnetic anisotropy in the hard axis direction is set in a direction of an angle in a range of 30° or more and 90° or less with respect to the easy axis direction.

In this case, in a region in which the magnetic filed in the hard axis direction is zero or small, the magnetization pattern of the free layer is oriented in the easy axis direction at the first portion, and is oriented in the hard axis (in a direction of an angle in a range of 30° or more and 90° or less with respect to the easy axis direction) at the second portion.

Therefore, the magnetization pattern of the free layer in the magnetoresistive element in a half selected and deselected states which do not carry out magnetization inversion is comprised a plurality of C-shape magnetic zones, so that the inverted magnetic field is increased in size, thereby making it possible to effectively prevent a write error.

On the other hand, the magnetization pattern of the free layer of the magnetoresistive element in a selected state which carries out magnetization inversion is changed from the C-shape magnetic zone to the S-shape magnetic zone by means of a composite magnetic field of the magnetic field in the easy axis direction and the magnetic field in the hard axis direction, thus reducing an inverted magnetic field in size. Therefore, magnetization inversion can be carried out in a small switching magnetic field.

In addition, the remaining magnetization after written is comprised a plurality of C-shaped magnetic zones. Thus, even if the magnetization is downsized, a stable magnetic structure can be maintained.

Figure 26:
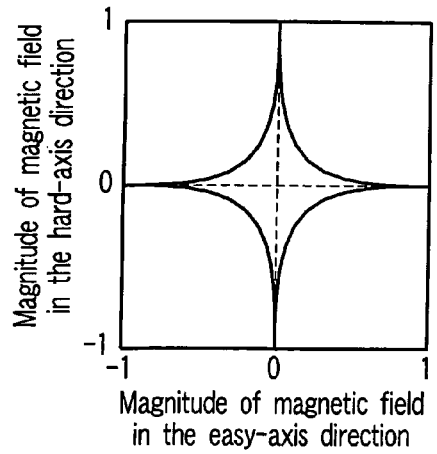
FIG. 26 is a view showing a switching curve of the magnetoresistive element of FIG. 25.
Figure 27:
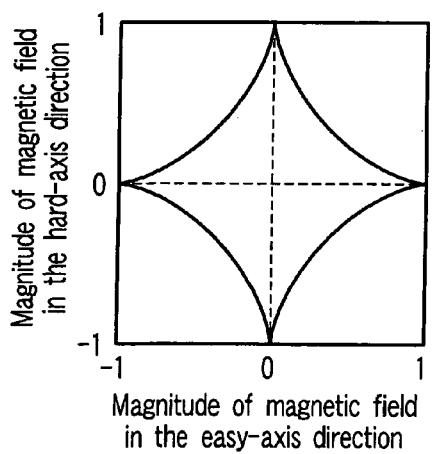
FIG. 27 is a view showing a switching curve obtained in a single magnetic zone model.

FIG. 26 shows a switching curve of the magnetoresistive element having the free layer of FIG. 25. FIG. 27 shows a switching curve (asteroid curve) obtained in a single magnetic zone model.

In comparison between FIGS. 26 and 27, the switching curve of the magnetoresistive element having the free layer of FIG. 25 is depressed more significantly than that obtained in the single magnetic zone model in a region in which both of the magnetic field in the easy axis direction and the magnetic field in the hard axis direction exist. This more significant depression denotes that the switching magnetic field (inverted magnetic field) is small.

Therefore, according to the magnetoresistive element having the free layer of FIG. 25, the inverted magnetic field is increase, thereby making it possible to prevent a write error in a region in which the magnetic field in the hard axis direction is zero or small (in the deselected case or half selected case). In addition, the inverted magnetic field is reduced in size, thereby making it possible to achieve low current consumption caused by the reduction of a write current in a region in which both of the magnetic field in the easy axis direction and the magnetic field in the hard axis direction exist (in the selected case).

The size of this depression depends also on the thickness of the free layer.

The depression itself of the switching curve can be formed by setting the thickness of the free layer to be 50 nm or more. However, considering high integration or low current consumption of the memory element in recent years, it is preferable that the thickness of the free layer considering the depression of the switching curve is set to a value in a range of 2 nm or more and 20 nm or less, and further, is set to a value in a range of 4 nm or more and 14 nm or less.

With respect to an aspect ratio of the planar shape of the free layer, it is preferable that vertical direction (hard axis direction): horizontal direction (easy axis direction) is set to a value ranging from 1:1 to 1:10. In actuality, the aspect ratio is set to a value ranging from 1:2 to 1:4 (approximately 1:2 in the present embodiment) from the viewpoint of high integration of a memory element or the like.

(10) Ninth Embodiment

Figure 28:
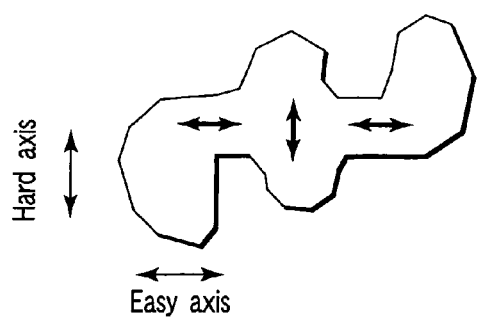
FIG. 28 is a view showing a free layer of a magnetoresistive element according to a ninth embodiment.

FIG. 28 shows a free layer of a magnetoresistive element according to a ninth embodiment of the present invention.

In this embodiment, the free layer of the magnetoresistive element has an approximate shape formed by combining two characters C with each other at their backs. Here, the free layer, as indicated by the arrow, is comprised first portions having magnetic anisotropy in the easy axis direction and a second portion having magnetic anisotropy in the hard axis direction.

Therefore, in a region in which the magnetic field in the hard axis direction is zero or small, the magnetization pattern of the free layer is oriented in the easy axis direction at the first portion, and is oriented in the hard axis direction (in a direction of an angle in a range of 30° or more and 90° or less with respect to the easy axis direction) at the second portion.

In this embodiment as well, the magnetization pattern of the free layer of the magnetoresistive element in the deselected and half selected states which do not carry out magnetization inversion is comprised a plurality of C-shape magnetic zones. Therefore, the inverted magnetic field is increased in size, so that a write error can be prevented.

On the other hand, the magnetization pattern of the free layer of the magnetoresistive element in the selected state which carries out magnetization inversion is changed from the C-shape magnetic zone to the S-shape magnetic zone by means of a composite magnetic field of the magnetic field in the easy axis direction and the magnetic field in the hard axis direction, thus reducing the inverted magnetic field in size. Therefore, magnetization inversion can be carried out by a small switching magnetic field.

In addition, the residual magnetization after written is comprised a plurality of C-shape magnetic zones. Thus, even if the magnetization is downsized, a stable magnetic structure can be maintained.

Figure 29:
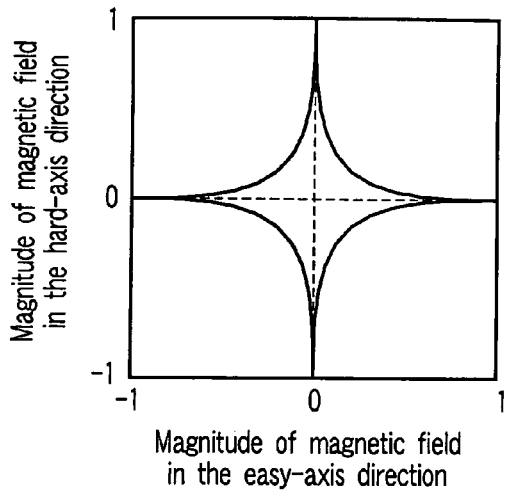
FIG. 29 is a view showing a switching curve of the magnetoresistive element of FIG. 28.

FIG. 29 shows a switching curve of the magnetoresistive element having the free layer of FIG. 28.

This switching curve is substantially identical to that of FIG. 26. That is, the depression of the switching curve of FIG. 29 is greater than that of the switching curve obtained in the single magnetic zone model shown in FIG. 27 in a region in which both of the magnetic field in the easy axis direction and the magnetic field in the hard axis direction exist.

Therefore, according to the magnetoresistive element having the planar shape of FIG. 28, in a region in which the magnetic field in the hard axis direction is zero or small (in the deselected case), the switching magnetic field is increased in size, whereby a write error can be prevented. In addition, in a region in which both of the magnetic field in the easy axis direction and the magnetic field in the hard axis direction exist (in the selected case), the switching magnetic field is reduced in size, thereby making it possible to achieve low current consumption due to the reduction of a write current.

The present embodiment is identical to the first embodiment in that the size of the depression of the switching curve depends on the thickness of the free layer. That is, the depression itself of the switching curve can be formed by setting the thickness of the free layer to be 50 nm or less. However, the actual thickness of the free layer is set to a value in a range of 2 nm or more and 20 nm or less, and further, is set to a value in a range of 4 nm or more and 14 nm or less.

With respect to an aspect ratio of the planar shape of the free layer as well, as in the first embodiment, vertical direction (hard axis direction) horizontal direction (easy axis direction) is set to a value ranging from 1:1 to 1:10. In actuality, the aspect ratio is set to a value ranging from 1:2 to 1:4 (approximately 1:2 in the present embodiment).

(11) Tenth embodiment

Figure 30:
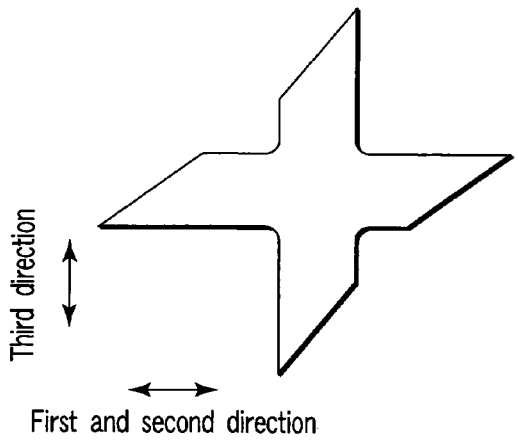
FIG. 30 is a view showing a free layer of a magnetoresistive element according to a tenth embodiment.

FIG. 30 shows a free layer of a magnetoresistive element according to a tenth embodiment of the present invention.

In this embodiment as well, the free layer of the magnetoresistive element has an approximate shape formed by combining two characters C with each other at their back. Specifically, the free layer of the embodiment has an approximate shape such that two parallelograms are crossed each other.

Since the free layer has the approximate shape such that the two parallelograms are crossed each other, the shape of a distal end of the free layer is comprised a tapered shape which is obliquely cut off instead of a rectangle.

An angle of the distal end (acute angle portion) of the free layer is set to a value in a range of 20° or more and less than 90°.

The angle of the distal end of the free layer used here denotes an angle at a corresponding portion of a mask used for processing the free layer. With respect to a free layer to be actually formed, the distal end is rounded with a certain curvature instead of an acute angle depending on the photolithography precision or processing precision and the like.

In order to determine this angle from the shape of the actually formed free layer, for example, an approximately linear portion obtained as an edge of the free layer is extended straight way, and a cross angle of a portion at which straight lines cross is defined as an angle of the distal end of the free layer.

In such a case as well, as indicated by the arrow, the free layer of the magnetoresistive element is comprised first portions having magnetic anisotropy in a first direction (for example, in the easy axis direction) and second portions having magnetic anisotropy in a third direction (for example, in the hard axis direction) which is different from the first direction and a second direction opposite to the first direction.

In the embodiment, the planar shape of the free layer of the magnetoresistive element becomes asymmetrical to a center point. However, for example, the planar shape is comprised a shape asymmetrical to the center porting, whereby two C-shape magnetic zones may be formed, at shown in FIGS. 31 and 32.

Figures 31, 34:
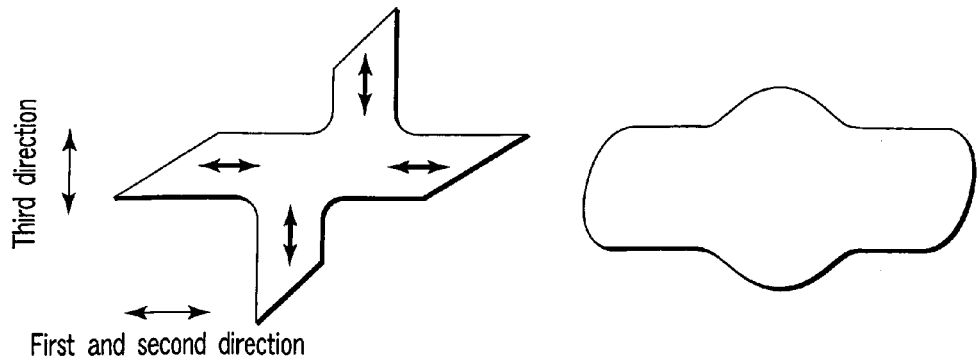
FIG. 31 is a view showing a modified example of the magnetoresistive element of FIG. 30.
FIG. 34 is a view showing a modified example of the magnetoresistive element of FIG. 30.
Figures 32, 35:
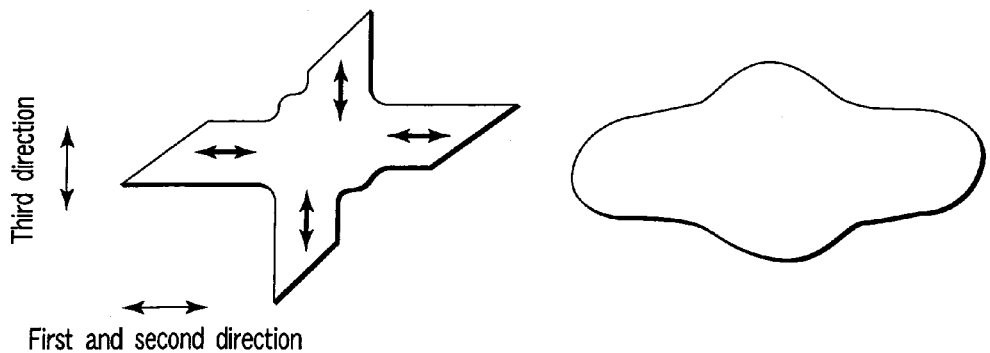
FIG. 32 is a view showing a modified example of the magnetoresistive element of FIG. 30.
FIG. 35 is a view showing a modified example of the magnetoresistive element of FIG. 30.
Figures 33, 36:
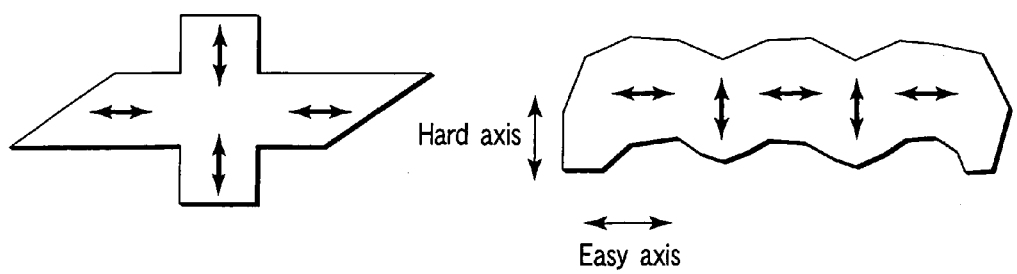
FIG. 33 is a view showing a modified example of the magnetoresistive element of FIG. 30.
FIG. 36 is a view showing a free layer of a magnetoresistive element according to an eleventh embodiment.

In addition, as shown in FIG. 33, an approximate shape may be formed such that one parallelogram and one rectangle are crossed each other. By actually applying the shape of FIG. 33 to the MTJ element, for example, an approximate shape as shown in FIGS. 34 and 35 is formed.

Also in the magnetoresistive element having the planar shape of FIGS. 30 to 35, the inverted magnetic field is increased in size, thereby making it possible to prevent a write error in a region in which the magnetic field in the hard axis direction is zero or small (in the deselected or half selected case). In addition, in a region in which both of the magnetic field in the easy axis direction and the magnetic field in the hard axis direction exist (in the selected case), the inverted magnetic field is reduced in size, so that it is possible to achieve low current consumption due to the reduction of a write current.

Since the thickness and aspect ratio of the free layer are identical to those according to the eighth embodiment, a duplicate description is omitted here.

(12) Eleventh Embodiment

FIG. 36 shows a free layer of a magnetoresistive element according to an eleventh embodiment of the present invention.

In this embodiment, the free layer of the magnetoresistive element has an approximate shape formed by combining three characters C. Here, the free layer is comprised first portions having magnetic anisotropy in the easy axis direction and second portions having magnetic anisotropy in the hard axis direction, as indicated by the arrow.

Therefore, the magnetization pattern in a region in which the residual magnetization of the free layer of the magnetoresistive element and the magnetic field in the hard axis direction are zero or small (in the deselected or half selected case), each is formed in three C-shape magnetic zones.

Figure 37:
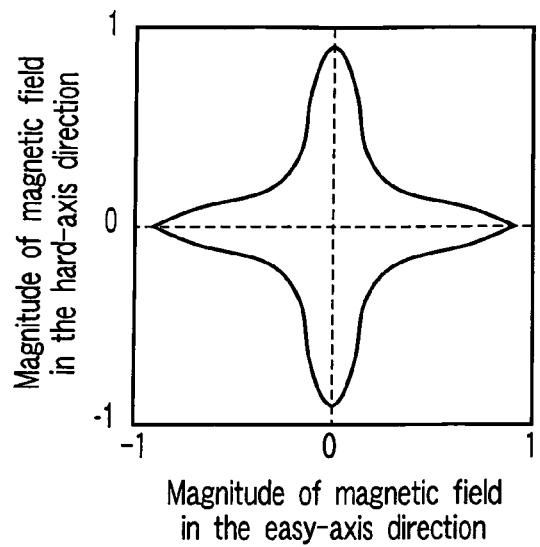
FIG. 37 is a view showing a switching curve of the magnetoresistive element of FIG. 36.

FIG. 37 shows a switching curve of the magnetoresistive element having the free layer of FIG. 36.

Also in the magnetoresistive element having the free layer of FIG. 36, the inverted magnetic field is increased in size, so that it is possible to prevent a write error in a region in which the magnetic field in the hard axis direction is zero or small (in the deselected or half selected case). In addition, the inverted magnetic field is reduced in size, thereby making it possible to achieve low current consumption due to the reduction of a write current in a region in which both of the magnetic filed in the easy axis direction and the magnetic field in the hard axis direction exist (in the selected case).

Since the thickness and aspect ratio of the free layer are identical to those according to the eighth embodiment, a duplicate description is omitted here.

(13) Twelfth Embodiment

Figure 38:
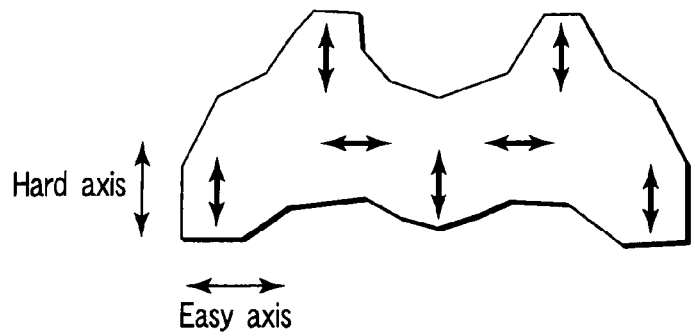
FIG. 38 is a view showing a free layer of a magnetoresistive element according to a twelfth embodiment.

FIG. 38 shows a free layer of a magnetoresistive element according to a twelfth embodiment of the present invention.

In this embodiment, the free layer of the magnetoresistive element has an approximate shape formed by combining three characters C. Specifically, the free layer has the approximate shape such that a specific single character C is combined with a character C oriented in the same direction and a character C oriented in an opposite direction with respect to the specific single character C. Here, the free layer is comprised first portions having magnetic anisotropy in the easy axis direction and second portions having magnetic anisotropy in the hard axis direction, as indicated by the arrow.

Therefore, the magnetization pattern in a region in which the residual magnetization of the free layer of the magnetoresistive element and the magnetic field in the hard axis direction are zero or small (in the deselected or half selected case), each is formed in three C-shape magnetic zones.

Also in the magnetoresistive element having the free layer of FIG. 38, the inverted magnetic field is increased in size, thereby making it possible to prevent a write error in a region in which the magnetic field in the hard axis direction is zero or small (in the deselected or half selected case). In addition, the inverted magnetic field is reduced in size, so that it is possible to achieve low current consumption due to the reduction of a write current in a region in which both of the magnetic filed in the easy axis direction and the magnetic field in the hard axis direction exist (in the selected case).

Since the thickness and aspect ratio of the free layer are identical to those according to the eighth embodiment, a duplicate description is omitted here.

(14) Thirteenth Embodiment

Figure 39:
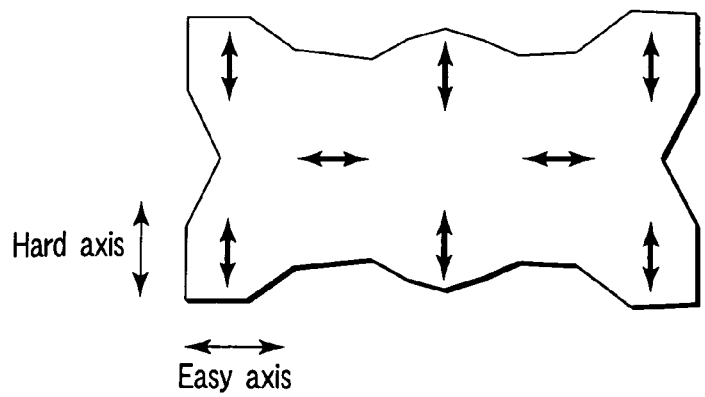
FIG. 39 is a view showing a free layer of a magnetoresistive element according to a thirteenth embodiment.

FIG. 39 shows a planar shape of a free layer of a magnetoresistive element according to a thirteenth embodiment of the present invention.

In this embodiment, the free layer of the magnetoresistive element has an approximate shape formed by combining four characters C. Specifically, the free layer has the approximate shape such that a specific single character C is combined with a character C oriented in the same direction and characters C oriented in an opposite direction with respect to the specific single character C. Here, the free layer is comprised first portions having magnetic anisotropy in the easy axis direction and second portions having magnetic anisotropy in the hard axis direction, as indicated by the arrow.

Therefore, the magnetization pattern in a region in which the residual magnetization of the free layer of the magnetoresistive element and the magnetic field in the hard axis direction are zero or small (in the deselected or half selected case), each is formed in a four C-shape magnetic zones.

Also in the magnetoresistive element having the free layer of FIG. 39, the inverted magnetic field is increased in size, thereby making it possible to prevent a write error in a region in which the magnetic field in the hard axis direction is zero or small (in the deselected or half selected case). In addition, the inverted magnetic field is reduced in size, so that it is possible to achieve low current consumption due to the reduction of a write current in a region in which both of the magnetic filed in the easy axis direction and the magnetic field in the hard axis direction exist (in the selected case).

Since the thickness and aspect ratio of the free layer are identical to those according to the eighth embodiment, a duplicate description is omitted here.

(15) Fourteenth Embodiment

Figure 40:
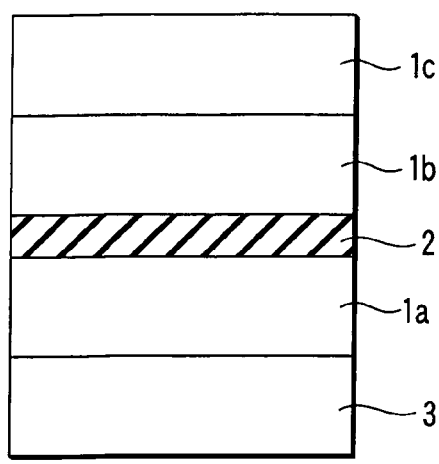
FIG. 40 is a view showing a sectional structure of a magnetoresistive element according to an example of the present invention.

The present embodiment relates to an example in which the free layer of the magnetoresistive element according to the eighth to thirteenth embodiments described above is comprised a stacked structure made of two or more different ferromagnetic layers. For example, as shown in FIG. 40, the ferromagnetic layer obtained as a free layer of the magnetoresistive element is comprised two types of ferromagnetic layers 1b and 1c.

When the free layer of the magnetoresistive element is composed such two types of ferromagnetic layers 1b and 1c, the switching curve of the magnetoresistive element significantly extends in the hard axis direction, as shown in FIG. 47.

In such a switching curve, the magnetization state of the memory element in a so-called half selected state can be stabilized, and a write error can be effectively prevented. In addition, in this case, the switching curve is sufficiently spaced from the hard axis direction. Thus, a shift effect of the switching curve caused by the leakage magnetic field from a nail junction or a pinned layer is reduced in size, and a dispersion of the switching curves is minimized.

The "two type" used here denotes a "different magnetic property", and the different magnetic properties can be achieved by, for example, the film thickness, film forming condition, material, structure (soft layer and hard layer) of the ferromagnetic layer.

Figure 41:
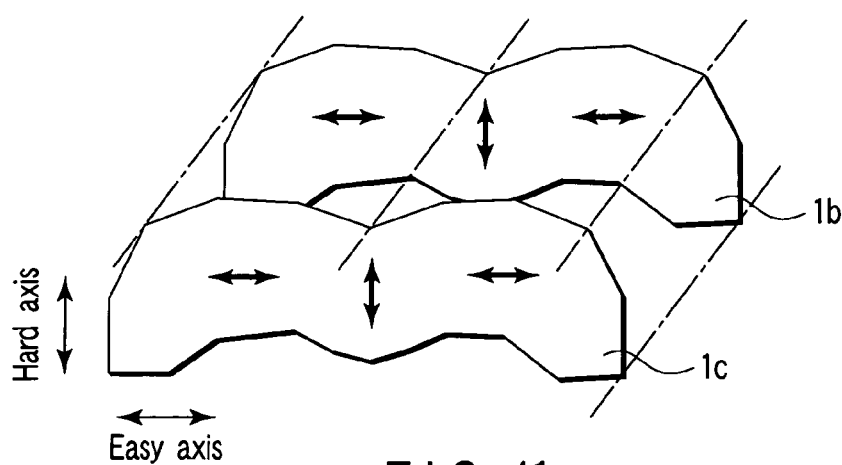
FIG. 41 is a view showing a structural example 1 of a free layer of a magnetoresistive element according to a fourteenth embodiment.

FIG. 41 shows a structural example 1 of the magnetoresistive element according to the fourth embodiment.

This example is featured in that the free layer of the magnetoresistive element of FIG. 25 is comprised two types of ferromagnetic layers 1b and 1c.

The ferromagnetic layers 1b and 1c each are comprised first portions having magnetic anisotropy in the easy axis direction and a second portion having magnetic anisotropy in the hard axis direction. In addition, the ferromagnetic layers 1b and 1c are combined with each other in a ferromagnetic manner or are combined with each other in an anti-ferromagnetic manner.

The magnetization states of the ferromagnetic layers 1b and 1c may be oriented in the same direction or may be oriented in opposite directions to each other.

Figure 42:
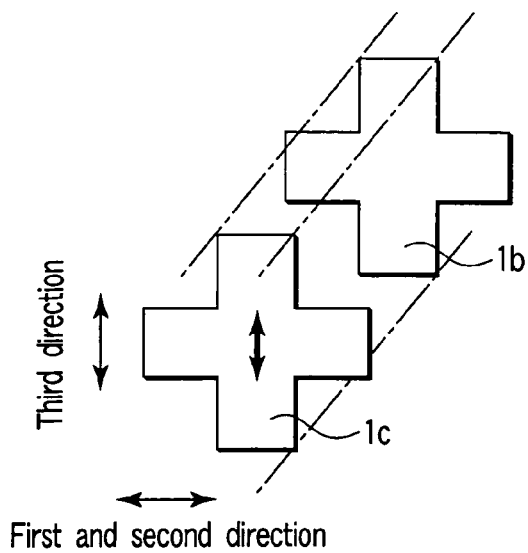
FIG. 42 is a view showing a structural example 2 of the free layer of the magnetoresistive element according to the fourteenth embodiment.

FIG. 42 shows a structural example 2 of the free layer according to the fourteenth embodiment.

This example is featured in that a free layer of a cross-shaped magnetoresistive element is comprised two types of ferromagnetic layers 1b and 1c.

In addition, the example is featured in that the ferromagnetic layers 1b and 1c each have an approximate shape formed by combining two characters C. A cross shape is shown a one example. The ferromagnetic layers 1b and 1c are combined with each other in a ferromagnetic manner or are combined with each other in an anti-ferromagnetic manner.

The ferromagnetic layer 1b is composed so as to have magnetic anisotropy in a first direction, as indicated by the arrow. The ferromagnetic layer 1c is composed so as to have magnetic anisotropy in the first direction and a third direction which is different from the first direction and a second direction opposite to the first direction, as indicated by the arrows.

In order to make the orientations of magnetic anisotropy different from each other, for example, it is possible to use a method of making different an orientation of a magnetic field applied when the ferromagnetic layer 1b is formed as a film and an orientation of a magnetic field applied when the ferromagnetic layer 1c is formed as a film.

FIG. 42 assumes that a magnetic zone structure in which the magnetization orientation has been gradually changed in a helical shape is provided in a region between the ferromagnetic layer 1b and the ferromagnetic layer 1c.

In this case, the residual magnetization of the free layer of the magnetoresistive element and the magnetization pattern in a region in which the magnetic field in the hard axis direction are zero or small (in the deselected or half selected case) each are comprised two C-shape magnetic zones.

(16) Fifteenth Embodiment

The present embodiment relates to an example in which the free layer of the magnetoresistive element according to the eighth to thirteenth embodiments described above is comprised a stacked structure made of two or more different ferromagnetic layers. However, in this embodiment, unlike the fourteenth embodiment described above, for example, as shown in FIGS. 43 and 44, the ferromagnetic layer obtained as a free layer of the magnetoresistive element is comprised two types of ferromagnetic layers 1b and 1c and a nonmagnetic layer 4 disposed between these ferromagnetic layers.

The nonmagnetic layer 4 is disposed between the ferromagnetic layers 1b and 1c, whereby a junction called an inter-layered junction occurs between the ferromagnetic layers 1b and 1c. The inter-layered junction generates a ferromagnetic junction or an anti-ferromagnetic junction between the ferromagnetic layers 1b and 1c depending on the thickness of the nonmagnetic layer 4.

FIG. 43 shows an example of a case in which the nonmagnetic layer 4 is made of an electrically conductive element, and FIG. 44 shows an example of a case in which the nonmagnetic layer 4 is made of an insulating element.

When the free layer of the magnetoresistive element is comprised the ferromagnetic layers 1b and 1c and the nonmagnetic layer 4 disposed between the ferromagnetic layers, the switching curve of the magnetoresistive element significantly extends in the hard axis direction, as shown in FIG. 47.

In such a switching curve, the magnetization state of a memory element in a so-called half selected state can be stabilized, and a write error can be effectively prevented. In addition, in this case, the switching curve is sufficiently spaced from the hard axis. Thus, a shift effect of the switching curve due to the leakage magnetic field from a nail junction or a pinned layer is reduced, and the dispersion of the switching curves is minimized.

FIG. 45 shows a structural example 1 of a free layer of a magnetoresistive element according to a fifteenth embodiment.

This example is featured in that the free layer of the magnetoresistive element of FIG. 25 is comprised the ferromagnetic layers 1b and 1c and a nonmagnetic layer 4 disposed between the ferromagnetic layers.

The ferromagnetic layers 1b and 1c are comprised first portions having magnetic anisotropy in the easy axis direction and a second portion having magnetic anisotropy in the hard axis direction. In addition, the ferromagnetic layers 1b and 1c are combined with each other in a ferromagnetic manner or are combined with each other in an anti-ferromagnetic manner.

The magnetization state of the ferromagnetic layers 1b and 1c may be oriented in the same orientation or may be oriented in opposite directions to each other.

FIG. 46 shows a structural example 2 of the free layer of the magnetoresistive element according to the fifth embodiment.

This example is featured in that a free layer of a cross-shaped magnetoresistive element is comprised ferromagnetic layers 1b and 1c and a nonmagnetic layer 4 disposed between the ferromagnetic layers.

In addition, the example is featured in that the ferromagnetic layers 1b and 1c have an approximate shape formed by combining two characters C. A cross shape is shown as an example. The ferromagnetic layers 1b and 1c are combined with each other in a ferromagnetic manner or are combined with each other in an anti-ferromagnetic manner.

The ferromagnetic layer 1b is composed so as to have magnetic anisotropy in a first direction, as indicated by the arrow. The ferromagnetic layer 1c is composed so as to have magnetic anisotropy in a third direction which is different from the first direction and a second direction opposite to the first direction, as indicated by the arrow.

In order to make the orientations of magnetic anisotropy different from each other, for example, it is possible to use a method of making different the orientation of the magnetic field applied when the ferromagnetic layer 1b is formed as a film and the orientation of the magnetic field applied when the ferromagnetic layer 1c is formed as a film, for example.

FIG. 46 assumes that a magnetic zone structure in which the magnetization orientation has been gradually changed in a helical manner is provided in a region between the ferromagnetic layer 1b and the ferromagnetic layer 1c.

In this case, the residual magnetization of the free layer of the magnetoresistive element and a magnetization pattern in a region in which the magnetization field in the hard axis direction is zero or small each are comprised two C shape magnetic zone.

(17) Others

The shapes according to the first to seventh embodiments described above can be easily achieved by contriving the shape of a mask used when the ferromagnetic layer is processed.

However, as the MTJ element is downsized, the shape of the mask does not completely coincide with that of the MTJ element. For example, a free layer is processed by transferring the shape of the mask to the free layer in accordance with photolithography and etching. At this time, blurring occurs at an acute angle portion at the time of photolithography or an amount of etching is increased.

Therefore, it is sufficient that the approximate shape of the MTJ element is comprised the shapes as shown in the first to seventh embodiments described above. A slight difference such as a rounded corner portion is included in the approximate shape of the MTJ element shown in the first to seventh embodiments described above.

In addition, the structures according to the eighth to fifteenth embodiments are defined by magnetic anisotropy of the free layer of the magnetoresistive element. Therefore, with respect to the eighth to fifteenth embodiments described above, the shape of the free layer is provided as a mere example, and is not featured in itself.

However, the free layer having magnetic anisotropy according to the example of the invention, the free layer having the shapes according to the eighth to fifteenth embodiments described above, can be easily achieved by contriving the shape of the mask used when the ferromagnetic layer is processed.

In addition, the free layers shown in FIGS. 25, 28, 30 to 36, 38 and 39 can be provided as a stacked structure, as shown in FIGS. 41 to 45.

3. Applied Example

The magnetoresistive element according to the example of the invention can be applied to a memory cell of a magnetic random access memory.

The magnetoresistive element according to the example of the invention can reduce a switching magnetic field sufficiently. Thus, when this element is applied to a free layer in a memory cell of the magnetic random access memory, the most advantageous effect can be attained.

Now, the magnetic random access memory will be described by way of some examples.

Figure 48:
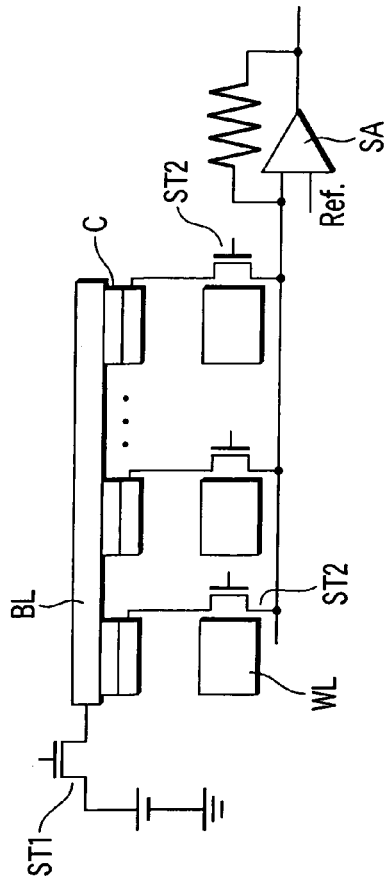
FIG. 48 is a view showing an example of a magnetic random access memory.

FIG. 48 shows a cross point type memory cell array.

A read/write word line WL and a read/write bit line BL cross each other, and a magnetoresistive element C is disposed at a cross portion between these lines. The magnetoresistive element C is electrically connected to the read/write word line WL and the read/write bit lines BL.

A diode D is disposed between the magnetoresistive element C and the read/write word line WL. The diode D has a function of preventing a so called diffraction current at the time of read/write operation specific to the cross point type memory cell array. The diffraction current is avoided by providing a bias voltage to this diode D and a deselected read/write word line WL and a deselected read/write bit line BL, for example.

To the read/write word line WL, for example, a sense amplifier SA is connected via a selector transistor STw. To the read/write bit line BL, for example, a power source is connected via a selector transistor STB.

Figure 49:
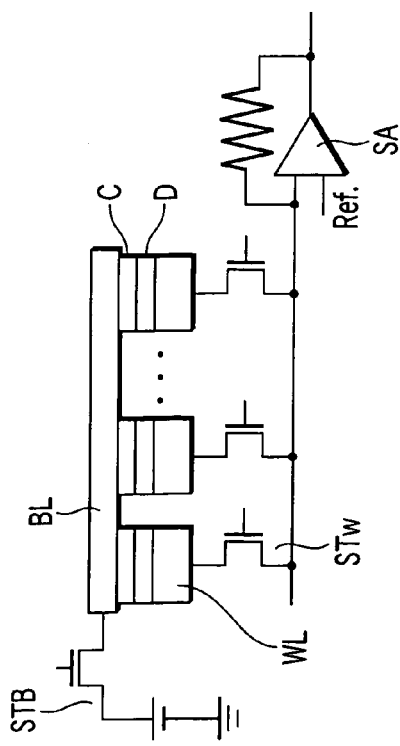
FIG. 49 is a view showing an example of the magnetic random access memory.

FIG. 49 shows a ladder shaped memory cell array.

A plurality of ladder-shaped magnetoresistive elements C are disposed between a write bit line BLw and a readout bit line BLr. The write bit line BLw and the readout bit line BLr extend in the same direction.

A write word line WL is disposed immediately beneath the magnetoresistive element C. The write word line WL is disposed to be spaced at a predetermined distance from the magnetoresistive element C, and extends in a direction crossing the write bit line BLw.

A resistor element R is connected to the readout bit line BLr via a selector transistor ST, for example. The sense amplifier SA senses readout data by detecting a voltage generated at both ends of the resistor element R. A power source is connected to one end of the write bit line BLw, and a grounding point is connected to the other end via the selector transistor ST, for example.

Figure 50:
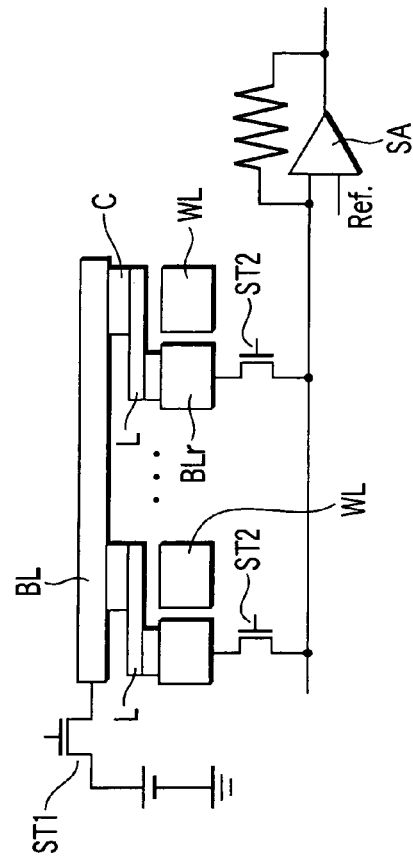
FIG. 50 is a view showing an example of the magnetic random access memory.
Figure 51:
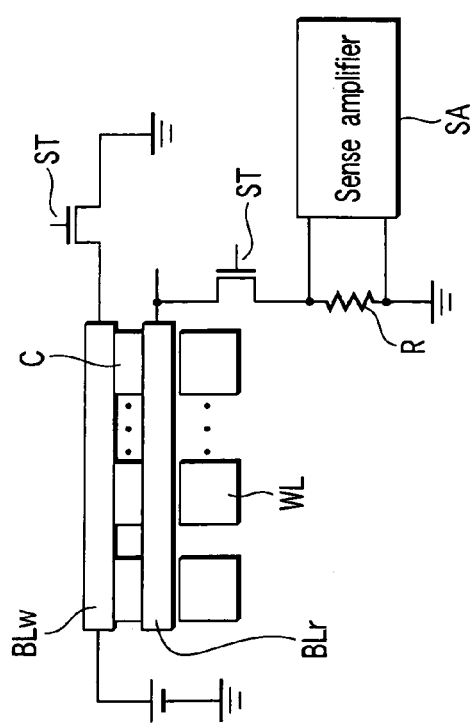
FIG. 51 is a view showing an example of the magnetic random access memory.

FIGS. 50 and 51 each show a single-transistor, single MTJ type memory cell array.

A write word line WL and a read/write bit line BL cross each other, and a magnetoresistive element C is disposed at a cross portion between these lines. The magnetoresistive element C is electrically connected to the read/write bit line BL. The write word line WL is disposed immediately beneath the magnetoresistive element C. The write word line WL is spaced at a predetermined distance from the magnetoresistive element C.

One end of the magnetoresistive element C is connected to the sense amplifier via a selector transistor ST2, for example. The read/write bit line BL is connected to a power source via the selector transistor ST1.

In the structure of FIG. 51, one end of the magnetoresistive element C is connected to a lower electrode L serving as a lead. Thus, even if the selector transistor ST2 is disposed immediately beneath the magnetoresistive element C, the write word line WL can be disposed in the vicinity of the magnetoresistive element C.

While the foregoing descriptions have been given with respect to typical examples of the magnetic random access memory to which the magnetoresistive element according to the example of the invention is applied, this example of the invention can be applied to a magnetoresistive random access memory other than these typical examples.

The easy axis direction of the magnetoresistive element may be parallel to the write word line or main be parallel to the write bit line. In addition, the easy axis direction of the magnetoresistive element may be oriented in a direction of 45° with respect to a direction in which two write lines (write word/bit lines) extend.

4. Others

According to the example of the invention, in a selected state which is a subject of magnetization inversion, a switching magnetic field at a write point (depressed portion) of a switching curve is reduced in size. In addition, in a self-selected state and a deselected state which is not a subject of magnetization inversion, there can be provided a magnetoresistive element whose magnetization state is stabilized.

In the case where the magnetoresistive element is used as a memory cell of a magnetic random access memory, a write current for generating a switching magnetic field required for magnetization inversion can be reduced in size, and low current consumption can be achieved. As described above, according to the example of the invention, there can be provided a magnetic memory which can achieve low current consumption and high integration and which can carry out switching (magnetization inversion) at a high speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
   first and second ferromagnetic layers; and
   a nonmagnetic layer disposed between the first and second ferromagnetic layers, wherein a planar shape of at least one of the first and second ferromagnetic layers has an approximate shape formed by combining two or more parts, each having a shape of a character C, wherein the two or more parts are oriented in different directions from each other; and
   wherein the two or more parts each have an approximate shape such that the shape of characters C are combined with each other at backs thereof or an approximate shape approximate to a shape of character Z.

2. The magnetoresistive element according to claim 1, wherein the thickness of each of the first and second magnetic layers is set to a value in the range of 0.1 nm or more and 50 nm or less.

3. A magnetic random access memory comprising:
   a memory cell which includes the magnetoresistive element according to claim 1; and
   a sense amplifier which is connected to one end of the magnetoresistive element.

* * * * *